(12) United States Patent
Reed

(10) Patent No.: US 9,360,198 B2
(45) Date of Patent: Jun. 7, 2016

(54) ADJUSTABLE OUTPUT SOLID-STATE LIGHTING DEVICE

(71) Applicant: Express Imaging Systems, LLC, Seattle, WA (US)

(72) Inventor: William G. Reed, Seattle, WA (US)

(73) Assignee: EXPRESS IMAGING SYSTEMS, LLC, Renton, WA (US)

( * ) Notice: Subject to any disclaimer, the term of this patent is extended or adjusted under 35 U.S.C. 154(b) by 46 days.

(21) Appl. No.: 13/707,123

(22) Filed: Dec. 6, 2012

(65) Prior Publication Data

US 2013/0163243 A1    Jun. 27, 2013

Related U.S. Application Data

(60) Provisional application No. 61/567,308, filed on Dec. 6, 2011.

(51) Int. Cl.
*H05B 37/02* (2006.01)
*F21V 1/00* (2006.01)
(Continued)

(52) U.S. Cl.
CPC ............ *F21V 23/04* (2013.01); *H05B 33/0803* (2013.01); *H05B 33/0815* (2013.01);
(Continued)

(58) Field of Classification Search
CPC ............ H05B 41/16; F21V 1/00; F21V 23/04
USPC ................. 362/235, 236, 241, 249, 439, 800; 315/247, 308 R, 360, 209 R, 246, 283, 315/291, 307, 308
See application file for complete search history.

(56) References Cited

U.S. PATENT DOCUMENTS

| 2,745,055 A | 5/1956 | Woerdemann |
| 3,374,396 A | 3/1968 | Bell et al. |

(Continued)

FOREIGN PATENT DOCUMENTS

| DE | 1001980 A1 | 8/1993 |
| EP | 1 734 795 A1 | 12/2006 |

(Continued)

OTHER PUBLICATIONS

Reed et al., "Apparatus and Method for Schedule Based Operation of a Luminaire," Office Action mailed Mar. 26, 2014, for U.S. Appl. No. 13/604,327, 10 pages.

(Continued)

*Primary Examiner* — Douglas W Owens
*Assistant Examiner* — Wei Chan
(74) *Attorney, Agent, or Firm* — Seed IP Law Group PLLC

(57) ABSTRACT

A solid-state lighting device has user-engageable actuator physically manipulable by a user and accessible from an exterior of the device to adjust an amount of light output. The user-engageable actuator may take the form of a knob, slider, lever, or other manipulable surface or structure. The user-engageable actuator may extend partially or fully from a housing, or alternatively be recessed or otherwise within the housing with access provided via an aperture, slot or opening. Access may be directly by the user (e.g., finger) or via a tool (e.g., screw driver, Allen wrench, socket) manipulated by the user. The actuator may form part of an adjustment component (e.g., potentiometer, rheostat) which supplies an adjustable output to a drive circuit or electronics. The adjustment component may be electrically coupled to either a primary or secondary side of a transformer, which forms part of a power converter (e.g., flyback).

23 Claims, 8 Drawing Sheets

(51) Int. Cl.
*F21V 23/04* (2006.01)
*H05K 13/00* (2006.01)
*H05B 33/08* (2006.01)
*F21K 99/00* (2016.01)
*F21S 8/02* (2006.01)
*H01R 33/945* (2006.01)
*F21Y 101/02* (2006.01)
*F21V 29/74* (2015.01)

(52) U.S. Cl.
CPC ........ *H05B33/0851* (2013.01); *H05K 13/0023* (2013.01); *F21K 9/13* (2013.01); *F21S 8/026* (2013.01); *F21V 29/74* (2015.01); *F21Y 2101/02* (2013.01); *H01R 33/9453* (2013.01); *Y02B 20/383* (2013.01); *Y10T 29/49117* (2015.01)

(56) References Cited

U.S. PATENT DOCUMENTS

| | | | |
|---|---|---|---|
| 4,153,927 A | 5/1979 | Owens | |
| 4,237,377 A | 12/1980 | Sansum | |
| 4,663,521 A | 5/1987 | Maile | |
| 4,811,176 A * | 3/1989 | Myhres | 362/205 |
| 5,086,379 A | 2/1992 | Denison et al. | |
| 5,160,202 A | 11/1992 | Légaré | |
| 5,161,107 A | 11/1992 | Mayeaux et al. | |
| 5,230,556 A | 7/1993 | Canty et al. | |
| 5,276,385 A | 1/1994 | Itoh et al. | |
| 5,343,121 A | 8/1994 | Terman et al. | |
| 5,349,505 A | 9/1994 | Poppenheimer | |
| 5,450,302 A | 9/1995 | Maase et al. | |
| 5,561,351 A | 10/1996 | Vrionis et al. | |
| 5,589,741 A | 12/1996 | Terman et al. | |
| 5,808,294 A | 9/1998 | Neumann | |
| 5,838,226 A * | 11/1998 | Houggy et al. | 340/12.32 |
| 5,869,960 A | 2/1999 | Brand | |
| 5,892,331 A | 4/1999 | Hollaway | |
| 5,892,335 A | 4/1999 | Archer | |
| 5,936,362 A | 8/1999 | Alt et al. | |
| 6,111,739 A | 8/2000 | Wu et al. | |
| 6,149,283 A * | 11/2000 | Conway | F21S 10/02 362/236 |
| 6,154,015 A | 11/2000 | Ichiba | |
| 6,377,191 B1 | 4/2002 | Takubo | |
| 6,612,720 B1 | 9/2003 | Beadle | |
| 6,674,060 B2 | 1/2004 | Antila | |
| 6,681,195 B1 | 1/2004 | Poland et al. | |
| 6,746,274 B1 | 6/2004 | Verfuerth | |
| 6,753,842 B1 | 6/2004 | Williams et al. | |
| 6,828,911 B2 | 12/2004 | Jones et al. | |
| 6,841,947 B2 | 1/2005 | Berg-johansen | |
| 6,902,292 B2 | 6/2005 | Lai | |
| 6,985,827 B2 | 1/2006 | Williams et al. | |
| 7,019,276 B2 | 3/2006 | Cloutier et al. | |
| 7,066,622 B2 | 6/2006 | Alessio | |
| 7,081,722 B1 * | 7/2006 | Huynh et al. | 315/323 |
| 7,122,976 B1 | 10/2006 | Null et al. | |
| 7,188,967 B2 | 3/2007 | Dalton et al. | |
| 7,190,121 B2 | 3/2007 | Rose et al. | |
| 7,196,477 B2 | 3/2007 | Richmond | |
| 7,239,087 B2 | 7/2007 | Ball | |
| 7,252,385 B2 | 8/2007 | Engle et al. | |
| 7,258,464 B2 | 8/2007 | Morris et al. | |
| 7,281,820 B2 | 10/2007 | Bayat et al. | |
| 7,294,973 B2 | 11/2007 | Takahama et al. | |
| 7,314,291 B2 | 1/2008 | Tain et al. | |
| 7,317,403 B2 | 1/2008 | Grootes et al. | |
| 7,322,714 B2 | 1/2008 | Barnett et al. | |
| 7,330,568 B2 | 2/2008 | Nagaoka et al. | |
| 7,339,323 B2 | 3/2008 | Bucur | |
| 7,339,471 B1 * | 3/2008 | Chan et al. | 340/541 |
| 7,405,524 B2 | 7/2008 | Null et al. | |
| 7,438,440 B2 | 10/2008 | Dorogi | |
| 7,440,280 B2 | 10/2008 | Shuy | |
| 7,461,964 B1 * | 12/2008 | Aubrey | 362/647 |
| 7,468,723 B1 | 12/2008 | Collins | |
| 7,524,089 B2 | 4/2009 | Park | |
| 7,538,499 B2 | 5/2009 | Ashdown | |
| 7,547,113 B2 * | 6/2009 | Lee | 362/231 |
| 7,559,674 B2 * | 7/2009 | He et al. | 362/249.02 |
| 7,564,198 B2 | 7/2009 | Yamamoto et al. | |
| 7,569,802 B1 | 8/2009 | Mullins | |
| 7,578,596 B2 | 8/2009 | Martin | |
| 7,578,597 B2 | 8/2009 | Hoover et al. | |
| 7,581,856 B2 * | 9/2009 | Kang et al. | 362/373 |
| 7,627,372 B2 | 12/2009 | Vaisnys et al. | |
| 7,631,324 B2 | 12/2009 | Buonasera et al. | |
| 7,633,463 B2 | 12/2009 | Negru | |
| 7,638,743 B2 | 12/2009 | Bartol et al. | |
| 7,677,753 B1 * | 3/2010 | Wills | 362/161 |
| 7,688,002 B2 | 3/2010 | Ashdown et al. | |
| 7,688,222 B2 | 3/2010 | Peddie et al. | |
| 7,703,951 B2 * | 4/2010 | Piepgras et al. | 362/373 |
| 7,746,003 B2 | 6/2010 | Verfuerth et al. | |
| D621,410 S | 8/2010 | Verfuerth et al. | |
| D621,411 S | 8/2010 | Verfuerth et al. | |
| 7,798,669 B2 | 9/2010 | Trojanowski et al. | |
| 7,804,200 B2 | 9/2010 | Flaherty | |
| 7,834,922 B2 | 11/2010 | Kurane | |
| 7,932,535 B2 | 4/2011 | Mahalingam et al. | |
| 7,940,191 B2 | 5/2011 | Hierzer | |
| 7,952,609 B2 | 5/2011 | Simerly et al. | |
| 7,960,919 B2 | 6/2011 | Furukawa | |
| 7,983,817 B2 | 7/2011 | Breed | |
| 7,985,005 B2 | 7/2011 | Alexander et al. | |
| 8,057,070 B2 * | 11/2011 | Negley et al. | 362/294 |
| 8,100,552 B2 | 1/2012 | Spero | |
| 8,118,456 B2 | 2/2012 | Reed et al. | |
| 8,143,769 B2 | 3/2012 | Li | |
| 8,174,212 B2 | 5/2012 | Tziony et al. | |
| 8,207,830 B2 | 6/2012 | Rutjes et al. | |
| 8,334,640 B2 * | 12/2012 | Reed et al. | 313/35 |
| 8,344,665 B2 | 1/2013 | Verfuerth et al. | |
| 8,376,583 B2 | 2/2013 | Wang et al. | |
| 8,395,329 B2 * | 3/2013 | Jutras | H05B 33/0851 315/246 |
| 8,445,826 B2 | 5/2013 | Verfuerth | |
| 8,476,565 B2 | 7/2013 | Verfuerth | |
| 8,586,902 B2 | 11/2013 | Verfuerth | |
| 8,604,701 B2 | 12/2013 | Verfuerth et al. | |
| 8,637,877 B2 * | 1/2014 | Negley | 257/88 |
| 8,749,635 B2 | 6/2014 | Högasten et al. | |
| 8,764,237 B2 | 7/2014 | Wang et al. | |
| 8,779,340 B2 | 7/2014 | Verfuerth et al. | |
| 8,779,686 B2 | 7/2014 | Jin | |
| 8,866,582 B2 | 10/2014 | Verfuerth et al. | |
| 8,872,430 B2 | 10/2014 | Yang | |
| 8,884,203 B2 | 11/2014 | Verfuerth et al. | |
| 8,921,751 B2 | 12/2014 | Verfuerth | |
| 2002/0084767 A1 | 7/2002 | Arai | |
| 2003/0016143 A1 | 1/2003 | Ghazarian | |
| 2003/0184672 A1 | 10/2003 | Wu et al. | |
| 2004/0192227 A1 | 9/2004 | Beach et al. | |
| 2005/0174780 A1 * | 8/2005 | Park | 362/294 |
| 2005/0231133 A1 * | 10/2005 | Lys | 315/291 |
| 2005/0243022 A1 * | 11/2005 | Negru | 345/46 |
| 2006/0001384 A1 * | 1/2006 | Tain et al. | 315/246 |
| 2006/0014118 A1 | 1/2006 | Utama | |
| 2006/0056172 A1 * | 3/2006 | Fiene | 362/147 |
| 2006/0066264 A1 | 3/2006 | Ishigaki et al. | |
| 2006/0098440 A1 * | 5/2006 | Allen | 362/294 |
| 2006/0146652 A1 | 7/2006 | Huizi et al. | |
| 2006/0208667 A1 * | 9/2006 | Lys | F21K 9/135 315/298 |
| 2007/0032990 A1 | 2/2007 | Williams et al. | |
| 2007/0102033 A1 | 5/2007 | Petrocy | |
| 2007/0153550 A1 * | 7/2007 | Lehman et al. | 362/648 |
| 2007/0164689 A1 | 7/2007 | Suzuki | |
| 2007/0224461 A1 | 9/2007 | Oh | |
| 2007/0225933 A1 | 9/2007 | Shimomura | |
| 2007/0230183 A1 * | 10/2007 | Shuy | 362/294 |
| 2007/0247853 A1 * | 10/2007 | Dorogi | 362/294 |

(56) References Cited

U.S. PATENT DOCUMENTS

| | | | |
|---|---|---|---|
| 2007/0279921 A1* | 12/2007 | Alexander et al. | 362/368 |
| 2008/0018261 A1* | 1/2008 | Kastner | 315/192 |
| 2008/0043106 A1 | 2/2008 | Hassapis et al. | |
| 2008/0094000 A1* | 4/2008 | Yamamoto et al. | 315/250 |
| 2008/0106907 A1* | 5/2008 | Trott et al. | 362/368 |
| 2008/0130304 A1 | 6/2008 | Rash et al. | |
| 2008/0205068 A1* | 8/2008 | Neeld et al. | 362/317 |
| 2008/0215279 A1 | 9/2008 | Salsbury et al. | |
| 2008/0224623 A1 | 9/2008 | Yu | |
| 2008/0232116 A1 | 9/2008 | Kim | |
| 2008/0248837 A1 | 10/2008 | Kunkel | |
| 2008/0266839 A1 | 10/2008 | Claypool et al. | |
| 2009/0046151 A1 | 2/2009 | Nagaoka et al. | |
| 2009/0058320 A1 | 3/2009 | Chou et al. | |
| 2009/0109625 A1* | 4/2009 | Booth et al. | 361/702 |
| 2009/0129067 A1 | 5/2009 | Fan et al. | |
| 2009/0153062 A1* | 6/2009 | Guo | H05B 33/0815 315/119 |
| 2009/0160358 A1 | 6/2009 | Leiderman | |
| 2009/0161356 A1* | 6/2009 | Negley et al. | 362/231 |
| 2009/0167203 A1 | 7/2009 | Dahlman et al. | |
| 2009/0195179 A1 | 8/2009 | Joseph et al. | |
| 2009/0230883 A1 | 9/2009 | Haug | |
| 2009/0235208 A1 | 9/2009 | Nakayama et al. | |
| 2009/0261735 A1 | 10/2009 | Sibalich et al. | |
| 2009/0268023 A1 | 10/2009 | Hsieh | |
| 2009/0273290 A1* | 11/2009 | Ziegenfuss | H05B 33/0815 315/193 |
| 2009/0278479 A1 | 11/2009 | Platner et al. | |
| 2009/0284155 A1 | 11/2009 | Reed et al. | |
| 2009/0315485 A1 | 12/2009 | Verfuerth et al. | |
| 2010/0001652 A1 | 1/2010 | Damsleth | |
| 2010/0052557 A1 | 3/2010 | Van Der Veen et al. | |
| 2010/0096460 A1 | 4/2010 | Carlson et al. | |
| 2010/0123403 A1 | 5/2010 | Reed | |
| 2010/0149822 A1* | 6/2010 | Cogliano et al. | 362/365 |
| 2010/0164406 A1* | 7/2010 | Kost et al. | 315/307 |
| 2010/0171442 A1* | 7/2010 | Draper et al. | 315/297 |
| 2010/0259193 A1 | 10/2010 | Umezawa et al. | |
| 2010/0270945 A1 | 10/2010 | Chang et al. | |
| 2010/0271802 A1* | 10/2010 | Recker et al. | 362/20 |
| 2010/0277082 A1 | 11/2010 | Reed et al. | |
| 2010/0295454 A1 | 11/2010 | Reed | |
| 2010/0295455 A1 | 11/2010 | Reed | |
| 2010/0295946 A1* | 11/2010 | Reed et al. | 348/164 |
| 2010/0309310 A1 | 12/2010 | Albright | |
| 2010/0328946 A1 | 12/2010 | Borkar et al. | |
| 2011/0001626 A1 | 1/2011 | Yip et al. | |
| 2011/0006703 A1 | 1/2011 | Wu et al. | |
| 2011/0026264 A1 | 2/2011 | Reed et al. | |
| 2011/0175518 A1 | 7/2011 | Reed et al. | |
| 2011/0204845 A1 | 8/2011 | Paparo et al. | |
| 2011/0215731 A1* | 9/2011 | Jeong | H05B 33/0854 315/254 |
| 2011/0221346 A1 | 9/2011 | Lee et al. | |
| 2011/0248812 A1 | 10/2011 | Hu et al. | |
| 2011/0251751 A1 | 10/2011 | Knight | |
| 2011/0310605 A1* | 12/2011 | Renn et al. | 362/235 |
| 2012/0001566 A1 | 1/2012 | Josefowicz et al. | |
| 2012/0019971 A1 | 1/2012 | Flaherty et al. | |
| 2012/0038490 A1 | 2/2012 | Verfuerth | |
| 2012/0119669 A1* | 5/2012 | Melanson et al. | 315/247 |
| 2012/0119682 A1 | 5/2012 | Warton | |
| 2012/0143383 A1 | 6/2012 | Cooperrider et al. | |
| 2012/0153854 A1 | 6/2012 | Setomoto et al. | |
| 2012/0169053 A1 | 7/2012 | Tchoryk, Jr. et al. | |
| 2012/0181935 A1 | 7/2012 | Velazquez | |
| 2012/0209755 A1 | 8/2012 | Verfuerth et al. | |
| 2012/0221154 A1 | 8/2012 | Runge | |
| 2012/0224363 A1* | 9/2012 | Van De Ven | 362/231 |
| 2012/0242254 A1 | 9/2012 | Kim et al. | |
| 2012/0262069 A1 | 10/2012 | Reed | |
| 2012/0320584 A1* | 12/2012 | Burkard et al. | 362/235 |
| 2013/0033183 A1 | 2/2013 | Verfuerth et al. | |
| 2013/0043792 A1 | 2/2013 | Reed | |
| 2013/0049613 A1 | 2/2013 | Reed | |
| 2013/0126715 A1 | 5/2013 | Flaherty | |
| 2013/0131882 A1 | 5/2013 | Verfuerth et al. | |
| 2013/0141000 A1 | 6/2013 | Wei et al. | |
| 2013/0141010 A1 | 6/2013 | Reed et al. | |
| 2013/0154488 A1 | 6/2013 | Sadwick et al. | |
| 2013/0193857 A1 | 8/2013 | Tlachac et al. | |
| 2013/0235202 A1 | 9/2013 | Nagaoka et al. | |
| 2013/0249429 A1 | 9/2013 | Woytowitz et al. | |
| 2013/0249479 A1 | 9/2013 | Partovi | |
| 2013/0340353 A1 | 12/2013 | Whiting et al. | |
| 2014/0001961 A1 | 1/2014 | Anderson et al. | |
| 2014/0070964 A1 | 3/2014 | Rupprath et al. | |
| 2014/0078308 A1 | 3/2014 | Verfuerth | |
| 2014/0097759 A1 | 4/2014 | Verfuerth et al. | |
| 2014/0203714 A1 | 7/2014 | Zhang et al. | |
| 2014/0244044 A1 | 8/2014 | Davis et al. | |
| 2014/0265894 A1 | 9/2014 | Weaver | |
| 2014/0313719 A1 | 10/2014 | Wang et al. | |
| 2015/0015716 A1 | 1/2015 | Reed et al. | |
| 2015/0077019 A1 | 3/2015 | Reed et al. | |
| 2015/0280782 A1 | 10/2015 | Airbinger et al. | |
| 2015/0312983 A1 | 10/2015 | Hu et al. | |

FOREIGN PATENT DOCUMENTS

| | | |
|---|---|---|
| EP | 2 559 937 A1 | 2/2013 |
| EP | 1 459 600 B1 | 2/2014 |
| EP | 2 781 138 A1 | 9/2014 |
| FR | 2 883 306 A1 | 9/2006 |
| JP | 6-335241 A | 12/1994 |
| JP | 2001-333420 A | 11/2001 |
| JP | 2004-279668 A | 10/2004 |
| JP | 2004-320024 A | 11/2004 |
| JP | 2004-349065 A | 12/2004 |
| JP | 2005-93171 A | 4/2005 |
| JP | 2005-198238 A | 7/2005 |
| JP | 2008-159483 A | 7/2005 |
| JP | 2005-310997 A | 11/2005 |
| JP | 2006-179672 A | 7/2006 |
| JP | 2006/244711 A | 9/2006 |
| JP | 2008-59811 A | 3/2008 |
| JP | 2008-509538 A | 3/2008 |
| JP | 2008-130523 A | 6/2008 |
| JP | 2008-535279 A | 8/2008 |
| JP | 2010-504628 A | 2/2010 |
| JP | 2008-177144 A | 1/2014 |
| KR | 2005078403 A | 8/2005 |
| KR | 10-2006-0086254 A | 7/2006 |
| KR | 10-2009-0042400 A | 4/2009 |
| KR | 10-0935736 B1 | 1/2010 |
| KR | 20-2010-007230 U | 7/2010 |
| KR | 10-1001276 B1 | 12/2010 |
| KR | 10-1044224 B1 | 6/2011 |
| KR | 10-1150876 B1 | 5/2012 |
| WO | 02/076068 A1 | 9/2002 |
| WO | 03/056882 A1 | 7/2003 |
| WO | 2005/003625 A1 | 1/2005 |
| WO | 2006/057866 A2 | 6/2006 |
| WO | 2007/023454 A1 | 3/2007 |
| WO | 2007/036873 A2 | 4/2007 |
| WO | 2008/030450 A2 | 3/2008 |
| WO | 2008/034242 A1 | 3/2008 |
| WO | 2009/040703 A2 | 4/2009 |
| WO | 2011/063302 A2 | 5/2011 |
| WO | 2011/129309 A1 | 10/2011 |
| WO | 2012/006710 A1 | 1/2012 |
| WO | 2012/142115 A2 | 10/2012 |
| WO | 2013/074900 A1 | 5/2013 |
| WO | 2014/018773 A1 | 1/2014 |
| WO | 2014/039683 A1 | 3/2014 |
| WO | 2014/078854 a1 | 5/2014 |

OTHER PUBLICATIONS

Reed et al., "Long-Range Motion Detection for Illumination Control," Amendment filed Apr. 28, 2014, for U.S. Appl. No. 12/784,080, 20 pages.

(56) References Cited

OTHER PUBLICATIONS

Reed, "Apparatus and Method of Energy Efficient Illumination," Notice of Allowance mailed Apr. 11, 2014, for U.S. Appl. No. 13/943,537, 9 pages.
Reed, "Apparatus and Method of Energy Efficient Illumination Using Received Signals," Office Action mailed Apr. 23, 2014, for U.S. Appl. No. 13/085,301, 12 pages.
Reed, "Electronic Control to Regulate Power for Solid-State Lighting and Methods Thereof," Office Action mailed Mar. 26, 2014, for U.S. Appl. No. 12/619,535, 16 pages.
International Search Report mailed Nov. 11, 2014, for International Application No. PCT/US2014/047867, 3 pages.
Reed et al., "Systems and Methods That Employ Object Recognition," Amendment filed Nov. 21, 2014, for U.S. Appl. No. 13/411,321, 20 pages.
Reed, "Apparatus and Method of Energy Efficient Illumination," Amendment filed Sep. 30, 2014, for U.S. Appl. No. 14/329,508, 18 pages.
Reed, "Apparatus and Method of Energy Efficient Illumination," Notice of Allowance mailed Nov. 5, 2014, for U.S. Appl. No. 14/329,508, 10 pages.
Reed, "Apparatus and Method of Energy Efficient Illumination Using Received Signals," U.S. Appl. No. 14/557,275, filed Dec. 1, 2014, 92 pages.
Reed, "High Efficiency Power Controller for Luminaire," U.S. Appl. No. 14/546,354, filed Nov. 18, 2014, 33 pages.
Written Opinion mailed Nov. 11, 2014, for International Application No. PCT/US2014/047867, 5 pages.
International Search Report, mailed Feb. 26, 2014, for PCT/US2013/070794, 3 pages.
Poplawski, "Exploring Flicker & LEDs," 2010 DOE SSL Market Introduction Workshop, U.S. Department of Energy, Jul. 22, 2010, 16 pages.
Reed et al., "Adjustable Output Solid-State Lamp With Security Features," Office Action mailed Feb. 27, 2014, for U.S. Appl. No. 13/679,687, 11 pages.
Reed et al., "Long-Range Motion Detection for Illumination Control," Office Action mailed Jan. 30, 2014, for U.S. Appl. No. 12/784,080, 26 pages.
Reed, "Ambient Light Control in Solid State Lamps and Luminaires," U.S. Appl. No. 61/933,733, filed Jan. 30, 2014, 8 pages.
Reed, "Photocontrol for Luminaire Consumes Very Low Power," U.S. Appl. No. 14/158,630, filed Jan. 17, 2014, 71 pages.
Reed, "Systems, Methods, and Apparatuses for Using a High Current Switching Device as a Logic Level Sensor," U.S. Appl. No. 61/764,395, filed Feb. 13, 2013, 48 pages.
Reed, "Systems, Methods, and Apparatuses for Using a High Current Switching Device as a Logic Level Sensor," U.S. Appl. No. 14/179,737, filed Feb. 13, 2014, 48 pages.
Written Opinion, mailed Feb. 26, 2014, for PCT/US2013/070794, 10 pages.
International Search Report, mailed Nov. 19, 2013 for PCT/US2013/052092, 4 pages.
International Search Report, mailed Dec. 30, 2013 for PCT/US2013/058266, 3 pages.
Reed, "Apparatus and Method of Energy Efficient Illumination," Office Action mailed Nov. 27, 2013, for U.S. Appl. No. 13/943,537, 8 pages.
Reed, "Apparatus and Method of Energy Efficient Illumination Using Received Signals," Amendment filed Jan. 2, 2014, for U.S. Appl. No. 13/085,301, 26 pages.
Reed, "High Efficiency Power Controller for Luminaire," U.S. Appl. No. 61/905,699, filed Nov. 18, 2013, 5 pages.
Written Opinion, mailed Nov. 19, 2013 for PCT/US2013/052092, 7 pages.
Written Opinion, mailed Dec. 30, 2013 for PCT/US2013/058266, 8 pages.
Extended European Search Report, dated Aug. 13, 2014, for corresponding European Application No. 09826926.9, 8 pages.
Reed et al., "Adjustable Output Solid-State Lamp With Security Features," Notice of Allowance mailed Aug. 29, 2014, for U.S. Appl. No. 13/679,687, 9 pages.
Reed et al., "Systems and Methods That Employ Object Recognition," Office Action mailed Aug. 25, 2014, for U.S. Appl. No. 13/411,321, 35 pages.
Reed, "Apparatus and Method of Energy Efficient Illumination," Office Action mailed Aug. 28, 2014, for U.S. Appl. No. 14/329,508, 8 pages.
Reed, "Apparatus and Method of Energy Efficient Illumination Using Received Signals," Notice of Allowance mailed Jul. 30, 2014, for U.S. Appl. No. 13/085,301, 5 pages.
Reed, "Electronic Control to Regulate Power for Solid-State Lighting and Methods Thereof," Office Action mailed Aug. 14, 2014, for U.S. Appl. No. 12/619,535, 16 pages.
Reed et al., "Adjustable Output Solid-State Lamp With Security Features," Amendment filed Jun. 24, 2014, for U.S. Appl. No. 13/679,687, 11 pages.
Reed et al., "Apparatus and Method for Schedule Based Operation of a Luminaire," Amendment filed Jun. 24, 2014, for U.S. Appl. No. 13/604,327, 14 pages.
Reed et al., "Apparatus and Method for Schedule Based Operation of a Luminaire," Notice of Allowance mailed Jul. 7, 2014, for U.S. Appl. No. 13/604,327, 8 pages.
Reed et al., "Long-Range Motion Detection for Illumination Control," Notice of Allowance mailed Jun. 20, 2014, for U.S. Appl. No. 12/784,080, 7 pages.
Reed, "Apparatus and Method of Energy Efficient Illumination," U.S. Appl. No. 14/329,508, filed Jul. 11, 2014, 61 pages.
Reed, "Apparatus and Method of Energy Efficient Illumination Using Received Signals," Amendment filed Jul. 23, 2014, for U.S. Appl. No. 13/085,301, 12 pages.
Reed, "Electronic Control to Regulate Power for Solid-State Lighting and Methods Thereof," Amendment filed May 27, 2014, for U.S. Appl. No. 12/619,535, 22 pages.
Reed, "Luminaire With Atmospheric Electrical Activity Detection and Visual Alert Capabilities," Notice of Allowance mailed Jul. 1, 2014, for U.S. Appl. No. 13/786,114, 9 pages.
Japanese Office Action, dated Jan. 6, 2015, for corresponding Japanese Application No. 2011-536564, 6 pages.
Reed et al., "Apparatus and Method for Schedule Based Operations of a Luminaire," Office Action mailed Mar. 2, 2015, for U.S. Appl. No. 14/552,274, 7 pages.
Reed et al., "Apparatus and Method of Operating a Luminaire," Amendment filed Mar. 19, 2015, for U.S. Appl. No. 13/558,191, 20 pages.
Reed et al., "Apparatus and Method of Operating a Luminaire," Office Action mailed Dec. 22, 2014, for U.S. Appl. No. 13/558,191, 17 pages.
Reed et al., "Systems and Methods That Employ Object Recognition," Office Action mailed Feb. 9, 2015, for U.S. Appl. No. 13/411,321, 40 pages.
Reed, "Ambient Light Control in Solid State Lamps and Luminaires," Amendment filed Jan. 29, 2015, for U.S. Appl. No. 14/609,168, 12 pages.
Reed, "Ambient Light Control in Solid State Lamps and Luminaires," U.S. Appl. No. 14/609,168, filed Jan. 29, 2015, 77 pages.
Reed, "Electronic Control to Regulate Power for Solid-State Lighting and Methods Thereof," Amendment filed Dec. 15, 2014, for U.S. Appl. No. 12/619,535, 21 pages.
Reed, "Low Power Photocontrol for Luminaire," U.S. Appl. No. 62/137,666, filed Mar. 24, 2015, 36 pages.
Reed, "Luminaire With Adjustable Illumination Pattern," U.S. Appl. No. 62/114,826, filed Feb. 11/015, 68 pages.
Reed, "Luminaire With Ambient Sensing and Autonomous Control Capabilities," Amendment filed Mar. 13, 2015, for U.S. Appl. No. 13/786,332, 23 pages.
Reed, "Luminaire With Ambient Sensing and Autonomous Control Capabilities," Office Action mailed Dec. 17, 2014, for U.S. Appl. No. 13/786,332, 20 pages.
International Search Report, mailed May 7, 2015, for corresponding International Application No. PCT/US2015/013512, 3 pages.

(56) References Cited

OTHER PUBLICATIONS

Reed et al., "Apparatus and Method for Schedule Based Operation of a Luminaire" Amendment filed Jun. 1, 2015, for U.S. Appl. No. 14/552,274, 14 pages.
Reed et al., "Apparatus and Method for Schedule Based Operation of a Luminaire" Notice of Allowance mailed Jun. 19, 2015, for U.S. Appl. No. 14/552,274, 8 pages.
Reed et al., "Apparatus and Method of Operating a Luminaire," Notice of Allowance mailed Apr. 27, 2015, for U.S. Appl. No. 13/558,191, 8 pages.
Reed et al., "Remotely Adjustable Solid-State Lamp," Preliminary Amendment and Response to Restriction Requirement, filed Apr. 1, 2015, for U.S. Appl. No. 13/875,130, 14 pages.
Reed et al., "Remotely Adjustable Solid-State Lamp," Amendment filed Jul. 20, 2015, for U.S. Appl. No. 13/875,130, 15 pages.
Reed et al., "Remotely Adjustable Solid-State Lamp," Corrected Notice of Allowance, mailed Aug. 12, 2015, and Notice of Allowance, mailed Jul. 31, 2015 for U.S. Appl. No. 13/875,130, 11 pages.
Reed et al., "Remotely Adjustable Solid-State Lamp," Office Action mailed Apr. 21, 2015, for U.S. Appl. No. 13/875,130, 9 pages.
Reed et al., "Systems and Methods That Employ Object Recognition," Amendment filed May 6, 2015, for U.S. Appl. No. 13/411,321, 20 pages.
Reed et al., "Systems and Methods That Employ Object Recognition," Amendment filed Jul. 7, 2015, for U.S. Appl. No. 13/411,321, 21 pages.
Reed, "Electronic Control to Regulate Power for Solid-State Lighting and Methods Thereof," Notice of Allowance mailed Apr. 23, 2015, for U.S. Appl. No. 12/619,535, 8 pages.
Reed, "Electronic Control to Regulate Power for Solid-State Lighting and Methods Thereof," U.S. Appl. No. 14/806,500, filed Jul. 22, 2015, 52 pages.
Written Opinion, mailed May 7, 2015, for PCT/US2015/013512, 10 pages.
Extended European Search Report, dated Oct. 15, 2015, for corresponding European Application No. 12825132.9—1802, 5 pages.
Extended European Search Report, dated Sep. 28, 2015, for corresponding European Application No. 12850159.0—1802, 6 pages.
Extended European Search Report dated Oct. 21, 2015, for corresponding EP Application No. 13835001.2—1802, 7 pages.
Reed et al., "Long-Range Motion Detection for Illumination Control," Office Action mailed Sep. 17, 2015, for U.S. Appl. No. 14/500,512, 17 pages.
Reed et al., "Long-Range Motion Detection for Illumination Control," Amendment filed Dec. 10, 2015, for U.S. Appl. No. 14/500,512, 18 pages.
Reed et al., "Systems and Methods That Employ Object Recognition," Office Action mailed Dec. 7, 2015, for U.S. Appl. No. 13/411,321, 47 pages.
Reed, "High Efficiency Power Controller for Luminaire," Office Action mailed Sep. 10, 2015, for U.S. Appl. No. 14/546,354, 15 pages.
Reed, "Luminaire With Switch-Mode Converter Power Monitoring," Notice of Allowance mailed Nov. 18, 2015, for U.S. Appl. No. 14/074,166, 9 pages.
Reed, "Solid State Lighting, Drive Circuit and Method of Driving Same," Notice of Allowance mailed Aug. 4, 2015, for U.S. Appl. No. 13/875,000, 10 pages.
Reed, "Systems, Methods, and Apparatuses for Using a High Current Switching Device as a Logic Level Sensor," Notice of Allowance for U.S. Appl. No. 14/179,737, mailed Nov. 6, 2015, 9 pages.
EE Herald, "Devices to protect High brightness LED from ESD," dated Mar. 16, 2009, retrieved Jun. 10, 2011, retrieved from http://www.eeherald.com/section/new-products/np100779.html, 1 page.
International Search Report, mailed Jul. 9, 2009 for PCT/US2009/043171, 3 pages.
International Search Report, mailed Jun. 21, 2010 for PCT/US2009/064625, 3 pages.
International Search Report, mailed Dec. 13, 2010 for PCT/US2010/035649, 3 pages.

International Search Report, mailed Dec. 28, 2010 for PCT/US2010/035651, 3 pages.
International Search Report, mailed Dec. 15, 2010 for PCT/US2010/035658, 3 pages.
International Search Report, mailed Oct. 8, 2012 for PCT/US2012/033059, 3 pages.
"LCD Backlight I/O Ports and Power Protection Circuit Design," dated May 2, 2011, retrieved Jun. 10, 2011, retrieved from http://www.chipoy.info/gadgets/lcd-backlight-i-o-ports-and-power-pr..., 4 pages.
Littelfuse, "Application Note: Protecting LEDs in Product Designs," 2009, 2 pages.
Panasonic Electronic Components, "LED Lighting Solutions," 2009, 6 pages.
Renesas Electronics, "Zener Diodes for Surge Absorption—Applications of high-intensity LED," Apr. 2010, 1 page.
Tyco Electronics, "Circuit Protection," retrieved Jun. 10, 2011, retrieved from http://www.tycoelectronics.com/en/products/circuit-protection.html, 2 pages.
Written Opinion, mailed Jul. 9, 2009 for PCT/US2009/043171, 8 pages.
Written Opinion, mailed Jun. 21, 2010 for PCT/US2009/064625, 5 pages.
Written Opinion, mailed Dec. 13, 2010 for PCT/US2010/035649, 4 pages.
Written Opinion, mailed Dec. 28, 2010 for PCT/US2010/035651, 3 pages.
Written Opinion, mailed Dec. 15, 2010 for PCT/US2010/035658, 3 pages.
Written Opinion, mailed Oct. 8, 2012 for PCT/US2012/033059, 3 pages.
Reed, "Apparatus and Method of Energy Efficient Illumination," U.S. Appl. No. 61/333,983, filed May 12, 2010, 57 pages.
Reed, "Apparatus and Method of Energy Efficient Illumination," U.S. Appl. No. 61/346,263, filed May 19, 2010, 67 pages.
Reed, "Apparatus and Method of Energy Efficient Illumination," Office Action mailed Dec. 5, 2012, for U.S. Appl. No. 12/784,091, 18 pages.
Reed, "Apparatus and Method of Energy Efficient Illumination," Office Action mailed Dec. 5, 2012, for U.S. Appl. No. 12/784,093, 13 pages.
Reed, "Apparatus and Method of Energy Efficient Illumination Using Received Signals ," U.S. Appl. No. 13/085,301, filed Apr. 12, 2011, 99 pages.
Reed, "Electronic Control to Regulate Power for Solid-State Lighting and Methods Thereof," U.S. Appl. No. 61/115,438, filed Nov. 17, 2008, 51 pages.
Reed, "Electronic Control to Regulate Power for Solid-State Lighting and Methods Thereof," U.S. Appl. No. 61/154,619, filed Feb. 23, 2009, 62 pages.
Reed, "Electrostatic Discharge Protection for Luminaire," U.S. Appl. No. 13/212,074, filed Aug. 17, 2011, 30 pages.
Reed, "Resonant Network for Reduction of Flicker Perception in Solid State Lighting Systems," U.S. Appl. No. 61/527,029, filed Aug. 24, 2011, 41 pages.
Reed et al., "Apparatus, Method to Change Light Source Color Temperature With Reduced Optical Filtering Losses," U.S. Appl. No. 61/295,519, filed Jan. 15, 2010, 35 pages.
Reed et al., "Apparatus, Method to Change Light Source Color Temperature With Reduced Optical Filtering Losses," U.S. Appl. No. 61/406,490, filed Oct. 25, 2010, 46 pages.
Reed et al., "Apparatus, Method to Enhance Color Contrast in Phosphor-Based Solid State Lights," U.S. Appl. No. 61/534,722, filed Sep. 14, 2011, 53 pages.
Reed et al., "Apparatus and Method for Schedule Based Operation of a Luminaire," U.S. Appl. No. 13/604,327, filed Sep. 5, 2012, 44 pages.
Reed et al., "Apparatus and Method of Operating a Luminaire," U.S. Appl. No. 13/558,191, filed Jul. 25, 2012, 84 pages.
Reed et al., "Electrically Isolated Heat Sink for Solid-State Light," U.S. Appl. No. 61/229,435, filed Jul. 29, 2009, 29 pages.
Reed et al., "Gas-Discharge Lamp Replacement," U.S. Appl. No. 61/052,924, filed May 13, 2008, 32 pages.

(56) References Cited

OTHER PUBLICATIONS

Reed et al., "Gas-Discharge Lamp Replacement With Passive Cooling," U.S. Appl. No. 61/174,913, filed May 1, 2009, 29 pages.
Reed et al., "Long-Range Motion Detection for Illumination Control," U.S. Appl. No. 61/180,017, filed May 20, 2009, 32 pages.
Reed et al., "Long-Range Motion Detection for Illumination Control," Office Action mailed Dec. 21, 2012, for U.S. Appl. No. 12/784,080, 26 pages.
Reed et al., "Low-Profile Pathway Illumination System," U.S. Appl. No. 61/051,619, filed May 8, 2008, 25 pages.
Reed et al., "Low-Profile Pathway Illumination System," Amendment filed Jul. 29, 2011, for U.S. Appl. No. 12/437,472, 19 pages.
Reed et al., "Low-Profile Pathway Illumination System," Notice of Allowance, dated Oct. 14, 2011, for U.S. Appl. No. 12/437,472, 9 pages.
Reed et al., "Low-Profile Pathway Illumination System," Office Action, dated May 5, 2011, for U.S. Appl. No. 12/437,472, 24 pages.
Reed et al., "Systems and Methods That Employ Object Recognition," U.S. Appl. No. 13/411,321, filed Mar. 2, 2012, 51 pages.
Reed et al., "Turbulent Flow Cooling for Electronic Ballast," U.S. Appl. No. 61/088,651, filed Aug. 13, 2008, 23 pages.
Renn et al., "Solid State Lighting Device and Method Employing Heat Exchanger Thermally Coupled Circuit Board," U.S. Appl. No. 61/357,421, filed Jun. 22, 2010, 49 pages.
International Search Report, mailed Feb. 27, 2013 for PCT/US2012/065476, 3 pages.
International Search Report, mailed Jan. 14, 2013 for PCT/US2012/052009, 3 pages.
International Search Report, mailed Sep. 30, 2011 for PCT/US2011/021359, 3 pages.
Kadirvel et al., "Self-Powered, Ambient Light Sensor Using bq25504," Texas Instruments, Application Report, SLUA629—Jan. 2012, 6 pages.
Reed et al., "Adjustable Output Solid-State Lamp With Security Features," U.S. Appl. No. 61/561,616, filed Nov. 18, 2011, 33 pages.
Reed, "Electronic Control to Regulate Power for Solid-State Lighting and Methods Thereof," Office Action mailed Feb. 28, 2013, for U.S. Appl. No. 12/619,535, 17 pages.
Reed, "Electronic Control to Regulate Power for Solid-State Lighting and Methods Thereof," Amendment filed May 24, 2013, for U.S. Appl. No. 12/619,535, 21 pages.
Reed, "Electronic Control to Regulate Power for Solid-State Lighting and Methods Thereof," Office Action mailed Jul. 30, 2013, for U.S. Appl. No. 12/619,535, 15 pages.
Reed, "Electronic Control to Regulate Power for Solid-State Lighting and Methods Thereof," Amendment filed Oct. 30, 2013, for U.S. Appl. No. 12/619,535, 5 pages.
Reed et al., "Long-Range Motion Detection for Illumination Control," Amendment filed Apr. 22, 2013, for U.S. Appl. No. 12/784,080, 17 pages.
Reed et al., "Long-Range Motion Detection for Illumination Control," Office Action mailed Jul. 22, 2013, for U.S. Appl. No. 12/784,080, 29 pages.
Reed et al., "Long-Range Motion Detection for Illumination Control," Amendment filed Sep. 27, 2013, for U.S. Appl. No. 12/784,080, 20 pages.
Reed et al., "Remotely Adjustable Solid-State Lamp," U.S. Appl. No. 13/875,130, filed May 1, 2013, 65 pages.
Reed et al., "Remotely Adjustable Solid-State Lamp," U.S. Appl. No. 61/641,781, filed May 2, 2012, 65 pages.
Reed, "Adjustable Output Solid-State Lighting Device," U.S. Appl. No. 61/567,308, filed Dec. 6, 2011, 49 pages.
Reed, "Apparatus and Method of Energy Efficient Illumination Using Received Signals," Office Action mailed Oct. 1, 2013, for U.S. Appl. No. 13/085,301, 11 pages.
Reed, "Luminaire With Atmospheric Electrical Activity Detection and Visual Alert Capabilities," U.S. Appl. No. 13/786,114, filed Mar. 5, 2013, 52 pages.
Reed, "Luminaire With Atmospheric Electrical Activity Detection and Visual Alert Capabilities," U.S. Appl. No. 61/649,159, filed Aug. 28, 2012, 52 pages.
Reed, "Luminaire With Switch-Mode Converter Power Monitoring," U.S. Appl. No. 61/723,675, filed Nov. 7, 2012, 73 pages.
Reed, "Luminaire With Switch-Mode Converter Power Monitoring," U.S. Appl. No. 14/074,166, filed Nov. 7, 2013, 73 pages.
Reed, "Photocontrol for Luminaire Consumes Very Low Power," U.S. Appl. No. 61/849,841, filed Jul. 24, 2013, 41 pages.
Reed, "Solid State Hospitality Lamp," U.S. Appl. No. 13/973,696, filed Aug. 22, 2013, 32 pages.
Reed, "Solid State Hospitality Lamp," U.S. Appl. No. 61/692,619, filed Aug. 23, 2012, 32 pages.
Reed, "Solid State Lighting, Drive Circuit and Method of Driving Same," U.S. Appl. No. 13/875,000, filed May 1, 2013, 24 pages.
Reed, "Solid State Lighting, Drive Circuit and Method of Driving Same," U.S. Appl. No. 61/640,963, filed May 1, 2012, 24 pages.
Reed, "Resonant Network for Reduction of Flicker Perception in Solid State Lighting Systems," Notice of Allowance mailed Sep. 30, 2013, for U.S. Appl. No. 13/592,590, 9 pages.
Reed, "Apparatus and Method of Energy Efficient Illumination," Amendment filed Apr. 4, 2013, for U.S. Appl. No. 12/784,091, 15 pages.
Reed, "Apparatus and Method of Energy Efficient Illumination," Office Action mailed Apr. 24, 2013, for U.S. Appl. No. 12/784,091, 12 pages.
Reed, "Apparatus and Method of Energy Efficient Illumination," Amendment filed May 14, 2013, for U.S. Appl. No. 12/784,091, 9 pages.
Reed, "Apparatus and Method of Energy Efficient Illumination," Notice of Allowance mailed May 23, 2013, for U.S. Appl. No. 12/784,091, 6 pages.
Reed, "Apparatus and Method of Energy Efficient Illumination," Amendment filed Apr. 2, 2013, for U.S. Appl. No. 12/784,093, 13 pages.
Reed, "Apparatus and Method of Energy Efficient Illumination," Notice of Allowance mailed Apr. 12, 2013, for U.S. Appl. No. 12/784,093, 9 pages.
Reed, "Apparatus and Method of Energy Efficient Illumination," U.S. Appl. No. 13/943,537, filed Jul. 16, 2013, 67 pages.
Reed, "Electrostatic Discharge Protection for Luminaire," Office Action mailed Mar. 15, 2013, for U.S. Appl. No. 13/212,074, 11 pages.
Reed, "Electrostatic Discharge Protection for Luminaire," Amendment filed Jun. 17, 2013, for U.S. Appl. No. 13/212,074, 11 pages.
Reed, "Electrostatic Discharge Protection for Luminaire," Notice of Allowance mailed Sep. 12, 2013, for U.S. Appl. No. 13/212,074, 6 pages.
Reed, "Luminaire With Ambient Sensing and Autonomous Control Capabilities," U.S. Appl. No. 13/786,332, filed Mar. 5, 2013, 86 pages.
Reed, "Luminaire With Ambient Sensing and Autonomous Control Capabilities," U.S. Appl. No. 61/728,150, filed Nov. 19, 2012, 83 pages.
Written Opinion mailed Sep. 30, 2011 for PCT/US2011/021359, 4 pages.
Written Opinion, mailed Feb. 27, 2013, for PCT/US2012/065476, 8 pages.
Written Opinion, mailed Jan. 14, 2013 for PCT/US2012/052009, 5 pages.
Fairchild Semiconductor, "LED Application Design Guide Using Half-Bridge LLC Resonant Converter for 100W Street Lighting," AN-9729, Fairchild Semiconductor Corporation, Rev. 1.0.0, Mar. 22, 2011, 17 pages.
Huang, "Designing an LLC Resonant Half-Bridge Power Converter," 2010 Texas Instruments Power Supply Design Seminar, SEM1900, Topic 3, TI Literature No. SLUP263, Copyright 2010, 2011, Texas Instruments Incorporated, 28 pages.

* cited by examiner

ADJUSTABLE OUTPUT SOLID-STATE LIGHTING DEVICE

BACKGROUND

1. Technical Field

This disclosure is generally related to solid-state lighting devices having an adjustable output intensity.

2. Description of the Related Art

Traditional lighting systems adjust an output intensity of light by increasing or decreasing a line voltage, or by chopping the line voltage at some phase angle, either "phase cut" or "reverse phase cut". Phase cut dimmers typically use a semiconductor device which is switched off at the zero crossing of the AC line voltage, and switched on at some phase angle later in the cycle to effectively modulate the power into the lighting device. For example, a typical low-cost household dimmer uses a TRIAC or SCR device to switch the AC power off during the line cycle. Reverse phase cut dimmers use more complex circuitry to turn on the semiconductor device at the zero crossing of the AC line, and turn off at some phase angle later in the cycle. Reverse phase dimmers have the advantage of lower electrical noise and less electrical stress on the components.

The lighting systems typically employ a dimmer at a location where a user switches the lighting system ON and OFF. The dimmer and ON/OFF switch is usually spaced from the light(s), for example mounted on a wall, where the light(s) are mounted on a ceiling or overhead. The dimmer is manipulated to increase or decrease the line voltage or the phase angle of the AC input sine wave routed to all lights that are downstream of the dimmer. Thus, where there are two or more lights on a single circuit, the dimmer does not enable individualized intensity adjustment to each of the lights. This type of setup with multiple lights on a single circuit is common. For example, in a warehouse, stadium, theater, box store, or grocery store, overhead lighting is electrically divided into tracks that are switched ON and OFF with just one or a few switches. Thus, manipulating a dimmer will change the output intensity of an entire track or an entire floor of lighting.

Solid state light sources, for example Light Emitting Diodes (LEDs), are typically powered by power converters that convert the AC input power to a controlled current that is kept below the maximum current level for the particular type of LED used. Such power converters may have provisions for adjusting the light output of the LEDs either by adjusting the current through the LEDs or by Pulse Width Modulating (PWM) the current through the LEDs. Such light sources have the same restriction as other types of light sources in that all of the light sources on the power line are dimmed to the same level, which is not desirable in many locations. For example, it may be desirable to dim some light sources in areas where less light is required, and not dim other light sources connected to the same power line.

BRIEF SUMMARY

Lighting designers and installers often need to adjust the light output of the lamps after installation. For example, a shopping area may have need for brighter lighting near stairways, escalators, entrances, rest rooms, while desiring lower lighting levels at store fronts and self-illuminated displays or kiosks. Many other lighting installations would greatly benefit by having individual luminaires or lamps having adjustable light level outputs even when commonly wired to the same power supply lines, circuit or breaker.

Described herein are approaches to increasing and decreasing an output intensity of individual lighting devices.

In some instances, the lighting devices take the form of luminaires, essentially self-contained including solid-state light sources, power electronics, housing, thermal management structures, and optionally mounting hardware. Luminaires may be configured to be installed as a fixture in a structure and configured to be wired directly into the existing wiring or circuits of a structure such as a building.

In some instances, the lighting devices may take a form usable with existing fixtures (e.g., sockets, "cans" with sockets), including solid-state light sources, power electronics (interchangeably referred to herein as driver electronics or ballast), housing, thermal management structures, and optionally mounting hardware. Such lighting device may include a coupler (e.g., Edison screw type base) that allow physically and electrically detachably coupling to existing fixtures to receive power.

In further instances, the lighting devices may take a retrofit form usable with existing fixtures (e.g., sockets, "cans" with sockets). Such retrofit lighting devices may include a base component that includes power electronics, and a light component that includes solid-state light sources. The base may be selectively detachably physically and electrically coupleable to existing fixtures to receive power via a structure's conventional wiring or circuits. The light component may be selectively detachably physically and electrically coupleable the base, to receive electrical power via the power electronics thereof.

Whichever form, each lighting device includes a user-engageable actuator (e.g., knob, slide) that is coupled to a set of driver electronics to adjust an amount of light output by the solid-state light sources. The set of driver electronics increases and decreases the amount of light output by the solid-state light sources in response to manipulation of the user-engageable actuator by a user. For example, the user-engageable actuator may be coupled to a resistive adjustment component, forming a potentiometer or rheostat, to adjust an electrical signal supplied to the driver electronics.

The lighting devices of the present disclosure advantageously provide customizable output intensity for the solid-state light sources. By enabling customization, through adjustment, of the output intensity of individual lighting devices, the brightness of light at one or more specific areas can be dimmed or brightened without affecting the output intensity of other lighting devices that may share a common track or lighting circuit.

A lighting device to provide manually adjustable levels of solid state lighting may be summarized as including an adjustment component having a user-engageable actuator physically manipulable by a user and accessible by the user from an exterior of the lighting device to vary an output of the adjustment component; and a driver circuit electrically coupled to adjust an amount of light output by a number of solid-state light sources in response to the output of the adjustment component.

The adjustment component may be at least one of a potentiometer or a rheostat. The driver circuit may include a power converter having an output power level that is responsive to a control voltage supplied to the power converter as the output of the adjustment component. The driver circuit may include a power converter having an output supplied to the solid-state light sources with a duty cycle that is responsive to the output of the adjustment component. The user-engageable actuator or the adjustment component may have a finite number of distinct settings, where each of the distinct settings selects a respective resistance of the adjustment component. The lighting device may further include a housing that houses the driver circuit and at least a portion of the adjustment component. The lighting device may further include the number of solid-state light sources, wherein the solid-state light sources are housed by the housing. The actuator may include at least one of a knob or a slide at least partially extending from the housing. The actuator may include at least one of a knob or a slide received within the housing and accessible therefrom via a tool or direct contact by the user. The lighting device may be a luminaire lighting fixture fixable to a portion of a building and the user-engageable actuator is accessible by the user while the luminaire lighting device is fixed to the portion of the building. The lighting device may have at least one complementary coupler that physically and electrically detachably couples a lighting device to a lighting fixture and that transfers power from the lighting fixture to the lighting device.

A lighting system may be summarized as including a plurality of lighting devices each coupled to a common supply circuit, each of the lighting devices including a respective adjustment component having a user-engageable actuator physically manipulable by a user and accessible by the user from an exterior of the respective lighting device to vary an output of the adjustment component; and a respective driver circuit electrically coupled to adjust an amount of light output by a number of solid-state light sources of the respective lighting device in response to the output of the respective adjustment component.

A lighting device for use with solid-state light sources and for use with lighting fixtures having at least one coupler configured to provide detachable physical and electrical connections therewith may be summarized as including at least one complementary coupler that physically and electrically detachably couples to the coupler of the lighting fixture and that transfers power from the lighting fixture to the lighting device; a resistive adjustment component having at least two terminals and having a user-engageable actuator that varies an output of the resistive adjustment component between the at least two terminals in response to physical manipulation by a user; and a set of driver electronics electrically coupled between the complementary coupler and the resistive adjustment component and which adjusts an amount of light output by the solid-state light sources based at least in part on the output of the resistive adjustment component. The resistive adjustment component may be electrically connected directly to an input terminal of the set of driver electronics and determines an input signal at the input terminal, the input signal indicative of and responsive to a position of the user-engageable actuator. The resistive adjustment component may be a potentiometer that increases and decreases the input signal at the input terminal in response to manipulation by the user of the user-engageable actuator.

The lighting device may further include a housing having a cavity and an aperture that provides access from an exterior to the housing, the housing physically coupled to the at least one complementary coupler, the resistive adjustment component and the set of driver electronics at least partially received in the cavity of the housing. The user-engageable actuator may include an engagement structure selectively engageable by a portion of a tool received through the aperture in the housing. The user-engageable actuator may include a rotatable dial that is accessible from an exterior of the housing through the aperture. The user-engageable actuator may be a slideable lever that may be accessible from the exterior of the housing through the aperture and operation of which may vary a resistance between the at least two terminals of the resistive adjustment component.

The lighting device may further include a second coupler that provides detachable physical and electrical connections to the solid-state light sources having a second complementary coupler that physically and electrically detachably couples to the second coupler, the second coupler at least partially received in the housing.

The lighting device may further include a lens physically coupled to the housing, wherein the housing and the lens enclose the solid-state light sources. The resistive adjustment component may include a resistive network electrically coupled between the at least two terminals of the resistive adjustment component, the resistive network having a plurality of discrete resistive values, and the user-engageable actuator selectively switches between each of the plurality of discrete resistive values to vary the output of the resistive adjustment component. The set of driver electronics may include a feedback circuit responsive to current flowing through the solid-state light sources and that electrically couples to at least one of the at least two terminals of the resistive adjustment component; and an input terminal that receives feedback from the feedback circuit, and the set of driver electronics adjusts the amount of light output by the solid-state light sources based at least in part on the output of the resistive adjustment component received through the feedback at the input terminal. The feedback circuit may include a voltage divider having at least three terminals, one of which may be an output terminal, and one of the at least two terminals of the resistive adjustment component electrically may connect to the output terminal of the voltage divider, wherein the resistive adjustment component varies the voltage divider in response to manipulation of the user-engageable actuator by the user. The feedback circuit may include an amplifier having a feedback path and the feedback path of the amplifier may be negative. The resistive adjustment component may be a potentiometer that increases and decreases the amount of light output by the solid-state light sources by at least partially determining the feedback received at the input terminal.

A method of manufacturing a lighting device for use with solid-state light sources and for use with lighting fixtures having at least one coupler configured to provide detachable physical and electrical connections therewith may be summarized as including attaching at least one complementary coupler, that physically and electrically detachably couples to the coupler of the lighting fixture, to a housing; positioning a resistive adjustment component, having at least two terminals and having a user-engageable actuator that varies an output of the resistive adjustment component between the at least two terminals in response to manipulation by a user, at least partially in the housing; and electrically coupling a set of driver electronics, having at least one input terminal, between the complementary coupler and the resistive adjustment component to adjust an amount of light output by the solid-state light sources based at least in part on the output of the resistive adjustment component.

The method may further include electrically connecting at least one terminal of the resistive adjustment component to the input terminal of the set of driver electronics.

The method may further include positioning a second coupler, that detachably electrically and physically couples the solid-state light sources, at least partially in the housing.

The method may further include physically coupling a lens to the housing; and enclosing the solid-state light sources between the housing and the lens.

The method may further include positioning the user-engageable actuator, having a rotatable dial, at least partially out of the housing for manipulation by the user.

The method may further include positioning the user-engageable actuator, having a slideable lever, at least partially out of the housing for manipulation by the user.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with lighting systems, for example power converters, thermal management structures and subsystems, and/or solid state lights have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and the appended claims, references are made to a "node" or "nodes." It is understood that a node may be a pad, a pin, a junction, a connector, a wire, or any other point recognizable by one of ordinary skill in the art as being suitable for making an electrical connection within an integrated circuit, on a circuit board, in a chassis or the like.

The headings and Abstract of the Disclosure provided herein are for convenience only and do not interpret the scope or meaning of the embodiments.

Figure 1:
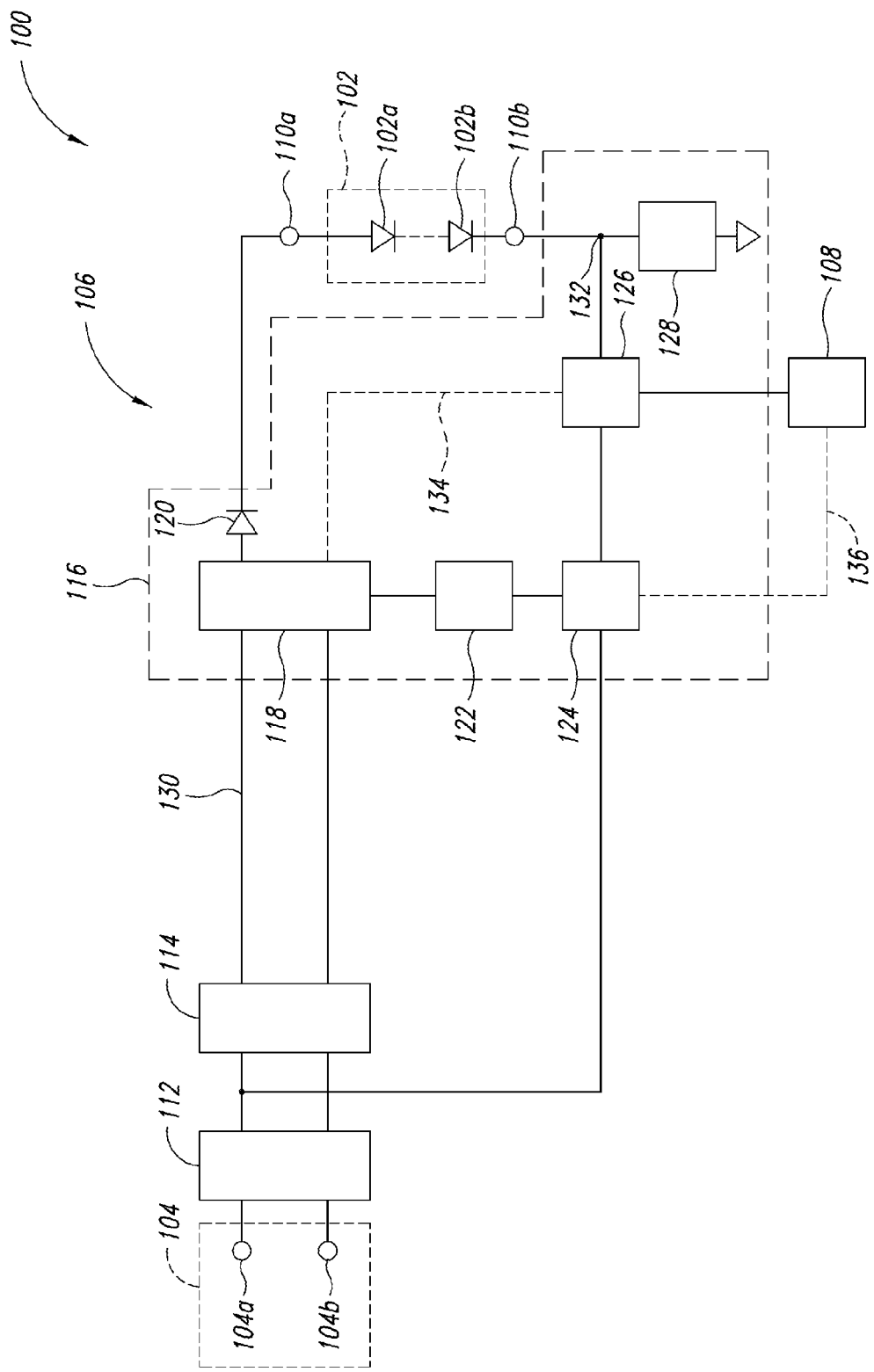
FIG. 1 is a block diagram of a lighting device, according to one illustrated embodiment.

FIG. 1 shows a lighting device 100, according to one embodiment. The description of FIG. 1 provides an overview of the structure and operation of the lighting device 100, which structure and operation are described in further detail with reference to FIGS. 2-4.

The lighting device 100 may include one or more solid-state light sources 102, a coupler 104, driver electronics 106, and a resistive adjustment component 108. The lighting device 100 may take the form of an integral or unitary structure that integrates the solid-state light sources 102, the coupler 104, the driver electronics 106, and the resistive adjustment component 108 into an integral or unitary structure. Alternatively, the lighting device 100 may take the form of a retrofit converter that integrates the coupler 104, the driver electronics 106, and the resistive adjustment component 108 into an integral or unitary structure. The retrofit converter electrically and physically detachably couples to the solid-state light sources 102. The retrofit converter can to drive the solid-state light sources 102 with power characteristics that are typically unavailable from traditional light fixture receptacles. Each of these are will be discussed and illustrated in more detail below in connection with FIGS. 4A-4B.

The lighting device 100 may include one or more light sources 102a-102n (collectively 102). The solid-state light sources 102 may, for example, take the form of one or more light emitting diodes (conventional LEDs, OLEDs). The solid-state light sources 102 will typically include a relatively large number of discrete light sources 102a-102n which will often be electrically coupled in series with one another to form one or more strings. Each of the light sources 102a-102n may, for example, include a string of 16 LEDs electrically coupled in series cathode to anode. Each LED may have a range of operating voltages ranging from 2.25 V to 3.5 V, so that the string of 16 LEDs may have a minimum turn on voltage of 36 V and may clamp at a maximum voltage drop of approximately 56 V.

The solid-state light sources 102 may physically and electrically couple to output terminals 110a, 110b (collectively 110) of the driver electronics 106 using several techniques. For example, the output terminals 110 may be electrically connected to a physical and electrical coupler, such as a screw-type light receptacle, and the solid-state light sources 102 may physically and electrically detachably couple to the output terminals 110 with a complementary screw-type coupler, such as the type used on a traditional incandescent light bulb. Alternatively, the solid-state light sources 102 may electrically couple to the output terminals 110 via electrically conductive wires or traces that are carried by one or more substrates, such as a printed circuit board.

The coupler 104 includes terminals 104a and 104b which may be configured to receive and provide electrical power for the solid-state light sources 102. The coupler 104 may be a screw-type coupler (Edison screw base) that is physically and electrically detachably coupleable to a traditional screw-in light receptacle. The coupler 104 may receive an AC voltage for the lighting system 100, for example, at 100-120 V and at 50-60 Hz. Alternatively, the coupler 104 may receive a DC voltage from, for example, a battery or other power supply.

The driver electronics 106 may be coupled between the solid-state light sources 102 and the coupler 104 to receive power from the coupler 104. The driver electronics 106 include a passive converter 112, DC input conditioner circuitry 114, and an active converter 116. In operation, the driver electronics 106 adjust an amount of light output by the solid-state light sources 102 based at least in part on an output of the resistive adjustment component 108.

The passive converter 112 may include one or more discrete components, such as diodes, inductors, capacitors, gas discharge tubes, and/or resistors, coupled to rectify and/or filter the voltage routed to the active controller 116. The passive converter 112 may be electrically coupled to the coupler 104 to receive an AC voltage. The passive converter 112 converts the AC voltage to a DC voltage. The passive converter 112 will typically include at least one passive diode bridge rectifier, such as a full-wave or half-wave rectifier, that performs the AC to DC conversion.

The DC input conditioner circuitry 114 may include one discrete component or several components coupled together to smooth and otherwise condition a DC input voltage. The DC input voltage may be received from the coupler 104, for example, via the passive converter 112. Alternatively, DC input voltage may be received directly, where available, without the passive converter 112, such as from a chemical battery, ultra-capacitor, or fuel-cell. The voltage received at the DC input conditioner circuitry 114 may be a substantially pre-filtered DC voltage or may be a DC voltage from a full-wave or half-wave AC rectifier of the passive converter 112. The DC input conditioner circuitry 114 may include a single capacitor electrically coupled between the terminals 104a and 104b to perform smoothing on the DC input voltage. DC input conditioner circuitry 114 may also include multiple capacitors, diodes, and resistors configured to smooth and condition the DC input voltage, to increase the Power Factor of the lighting device to a high level, such as 0.8 or above.

As illustrated in FIG. 1, the active converter 116 may be coupled between the coupler 104 and the solid-state light sources 102 to provide regulated power to the solid-state light sources 102. The active converter 116 may include a transformer 118, a diode 120, a switch 122, a controller 124, a feedback circuit 126, and a feedback discharge path 128. The active converter 116 may be configured as a switch mode power supply, such as a flyback DC/DC power converter. Alternatively, the driver electronics 106 may be configured as a forward converter or other electronic galvanically isolated type power converter, or a non-isolated Buck or other type of power converter.

The transformer 118 includes at least one primary side winding and at least one secondary side winding. The number of turns on the secondary side winding may be greater than the number of turns on the primary side winding so that the voltage induced on the secondary side of the transformer 118 is greater than the voltage on the primary side. The primary side of the transformer 118 may be coupled at a node 130 to the coupler 104 through the passive converter 112 and/or the DC input conditioner circuitry 114, to receive a filtered or conditioned voltage and/or current. The secondary side may be electrically coupled to at least one of the output terminals 110 of the driver electronics 106 through the diode 120 to provide power signals to regulate an output intensity of the solid-state light sources 102.

The switch 122 may be electrically coupled between the at least one primary side winding and a ground reference to selectively enable current to flow through the at least one primary side winding of the transformer 118. The switch 122 may take a variety of forms suitable for handling the expected currents and voltages. For example, the switch 122 may take the form of a metal oxide semiconductor field effect transistor (MOSFET), such as an n-channel MOSFET. The drain terminal of the switch 122 may be connected or coupled directly to the at least one primary side winding of transformer 118. The gate terminal of switch 122 may be operably coupled to the controller 124. Alternatively, the lighting device 100 may employ another type of switch, for example, an insulated gate bipolar transistor (IGBTs). While only one MOSFET is illustrated, the switch 122 may include two or more transistors electrically coupled in series or parallel.

The switch 122 selectively enables current to flow through the transformer 118 so that the transformer 118 functions as the inductor of the flyback converter topology. The frequency and duration of current flow through the switch 122, i.e., the primary side winding of the transformer 118, may be determined by the controller 124.

The controller 124 may be configured and electrically coupled to operate the switch 122 by varying a voltage at the gate of the switch 122. The controller 124 may include an oscillator and a pulse-width modulator. The pulse-width modulator may be driven by the oscillator to vary the voltage at the gate of the switch 122 with a plurality of pulses. The controller 124 may vary the output of the transformer 118 by controlling the frequency and duration (i.e., duty cycle) of current flow through the primary side windings of the transformer 118. The controller 124 may use the switch 122 to control the duty cycle of current flowing through the primary side windings by selectively coupling the primary side windings of the transformer 118 to a ground reference or potential through the switch 122. The switch 122 may electrically couple the at least one primary winding to ground through one or more passive electrical components, such as resistors and/or capacitors, that are electrically coupled between the switch 122 and the ground reference.

The controller 124 may vary the output of the transformer 118 in response to signals received from the feedback circuit 126. The feedback circuit 126 may be communicatively (e.g., electrically or optically) coupled or configured to provide signals to the controller 124 in response to current flowing through the solid-state light sources 102. The feedback circuit 126 may include one or more resistors, voltage dividers, diodes, capacitors, amplifiers, and optocouplers. The feedback circuit 126 may transmit feedback signals to the controller 124 that are representative of the current flowing from the solid-state light sources 102 through the feedback discharge path 128. Specifically, the feedback circuit 126 may compare or amplify a voltage at a node 132 that represents a voltage drop across the feedback discharge path 128 in response to the current flowing from the solid-state light sources 102 through the feedback discharge path 128. Alternatively, the feedback circuit 126 may provide a feedback voltage that is representative of currents or voltages induced in the transformer 118. In particular, the feedback circuit 126 may receive a voltage or current directly from a tertiary winding of the transformer 118 through a node 134 without monitoring the current through the solid-state light sources 102 at the node 132.

The resistive adjustment component 108 may be electrically connected to an input of the feedback circuit 126. The resistive adjustment component 108 may include at least two output terminals and a user-engageable actuator. In response to manipulation of the user-engageable actuator, the resistive adjustment component 108 may vary an output voltage between the at least two output terminals. For example, manipulation of the user-engageable actuator may alternatively increase and decrease the resistance between the at least two output terminals. The user-engageable actuator may be manipulable by direct contact from a mechanical tool (e.g., a screwdriver, or socket wrench) or with direct contact from a user. For example, the user-engageable actuator may be a rotatable dial, a slideable lever, or an engagement structure selectively engageable by a portion of a tool, such as a slot into which a screwdriver may be inserted. The resistive adjustment component 108 may be a potentiometer or rheostat.

The resistive adjustment component 108 may be electrically connected to the input of the feedback circuit 126 to adjust the feedback signals transmitted by the feedback circuit 126 to the controller 124. In particular, the resistive adjustment component 108 may be configured to adjust one or more reference voltages in the feedback circuit 126. The feedback circuit 126 compares the one or more reference voltages against the voltage drop across the feedback discharge path 128, i.e., the voltage at the node 132. Because the voltage at the node 132 represents the current flowing through the solid-state light sources 102, the one or more reference voltages may represent a light source current threshold. While the voltage at the node 132 is greater than the threshold, the feedback circuit 126 may transmit feedback signals to the controller 124 that are indicative of an amount of current flowing through the solid-state light sources 102. While the voltage at the node 132 is less than or equal to the threshold, the feedback circuit 126 may transmit feedback signals indicative of no current flowing through the solid-state light sources 102. Thus, manipulation of the resistive adjustment component 108 may increase or decrease the light source current threshold, resulting in a respective increase or decrease in an output intensity of the solid-state light sources 102.

Alternatively, the resistive adjustment component 108 may be configured to interface directly with the controller 124 without first going through the feedback circuit 126. For example, the resistive adjustment component 108 may be directly coupled or connected to an input of the controller 124 through a node 136. The controller 124 may accordingly increase or decrease the current flowing through the transformer 118 and the solid-state light sources 102 in response to adjustments made to the resistive adjustment component 108 using the user-engageable actuator.

Accordingly, the user-engageable actuator of the resistive adjustment component 108 may be manipulated to vary voltages in the driver electronics 106, i.e., the feedback circuit 126 or the controller 124, to produce corresponding variations in the output intensity of the solid-state light sources 102.

Figure 2A:
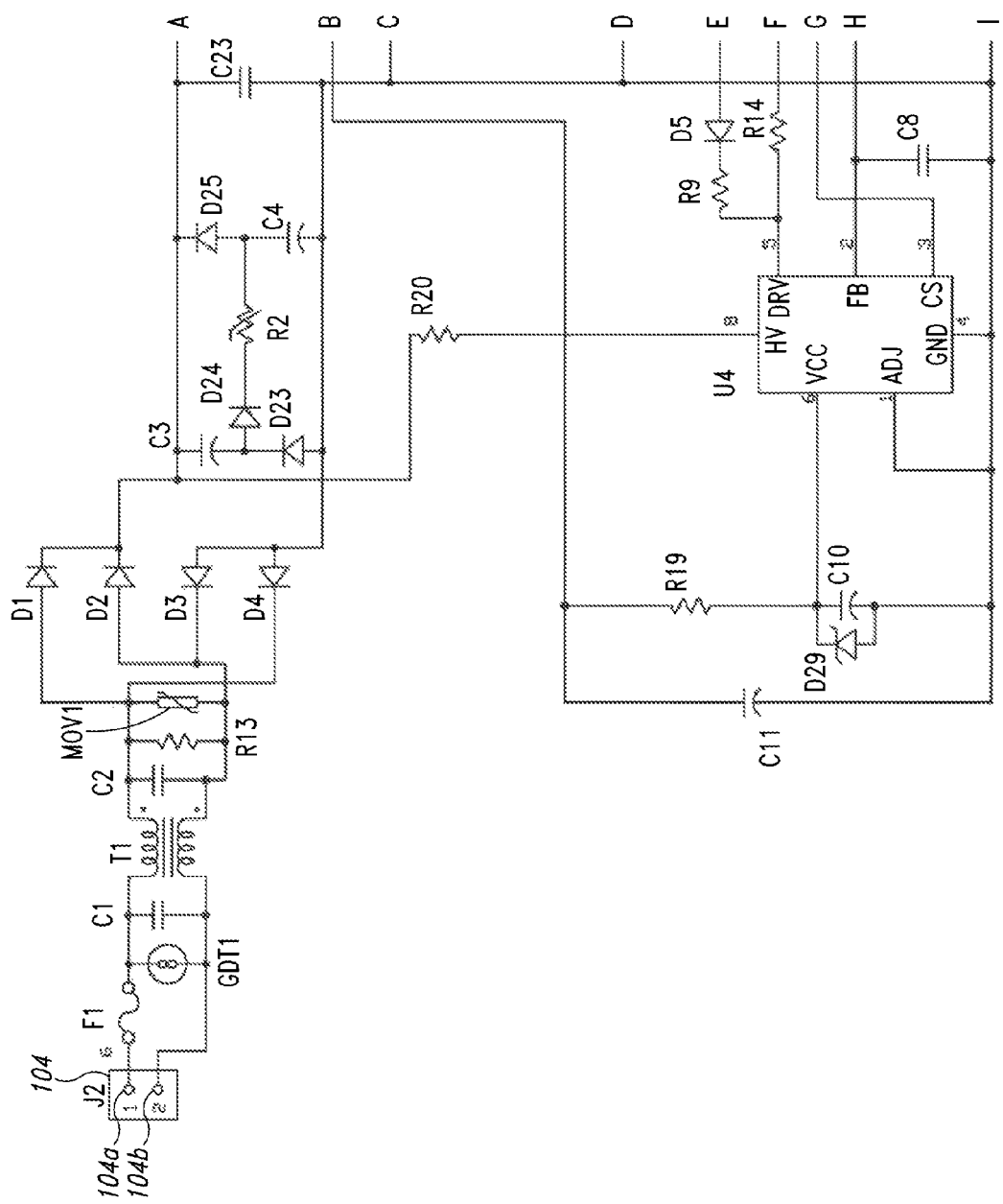
FIGS. 2A and 2B are a detailed electrical schematic diagram of a lighting device such as that illustrated in FIG. 1, according to one illustrated embodiment.
Figure 2B:
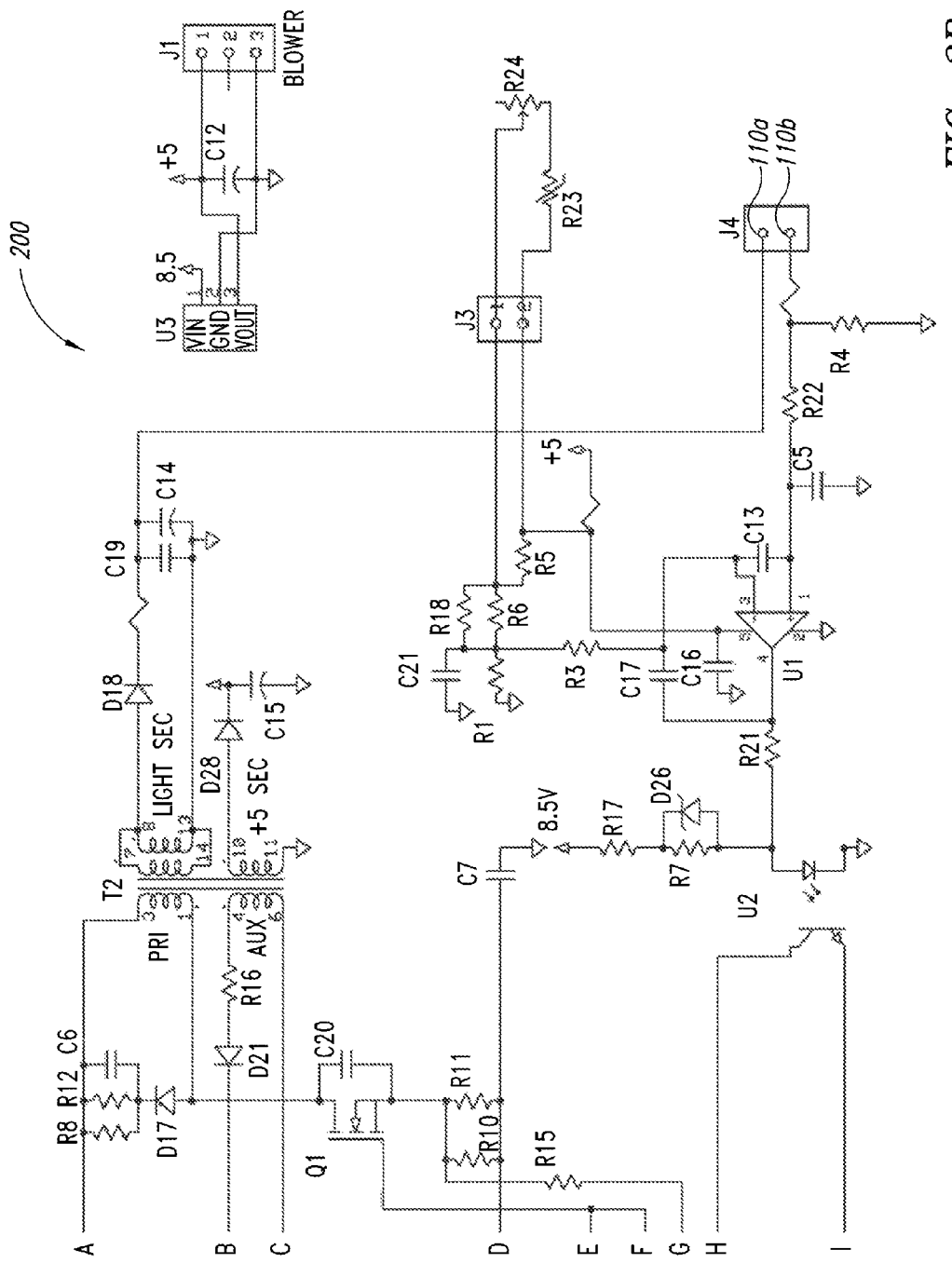

FIGS. 2a and 2b (collectively, FIG. 2) show a lighting device 200. The lighting device 200 may be a detailed implementation of the lighting device 100 (FIG. 1).

The lighting device 200 may, for example, be configured as a flyback power converter to supply power to the solid-state light sources 102, as described above in connection with FIG. 1. The lighting device 200 may be roughly broken into four components, the coupler 104, a solid-state light source coupler J4, driver electronics, and a resistive adjustment component R24.

The coupler 104 has been described above in connection with FIG. 1 and includes the terminals 104a and 104b to receive an input AC voltage. While described as an Edison screw-base, the coupler 104 may take any of a large variety of other forms, for instance, bayonet mounts and/or pins.

The solid-state light source coupler J4 includes the output terminals 110a and 110b of the driver electronics. The solid-state light source coupler J4 may be a physical and electrical coupler, such as a screw-type light receptacle, to which the solid-state light sources 102 may physically and electrically detachably couple to the output terminals 110 with a complementary screw-type coupler, such as the type used on a traditional incandescent light bulb. Alternatively, the solid-state light source coupler J4 may be electrically conductive wires or traces that are carried by one or more substrates, such as a printed circuit board, and that are non-detachably electrically connected to the solid-state light sources 102.

The driver electronics of lighting device 200 may be coupled between the coupler 104 and the solid-state light source coupler J4 to adjustably apply power to the solid-state light sources 102 based at least in part on an output of the resistive adjustment component R24. The driver electronics of lighting device 200 include AC conditioning circuitry, a rectifier circuit, DC conditioning circuitry, a converter transformer T2, a regulating circuit, and solid-state light source input smoothing circuitry.

The AC conditioning circuitry may include an input filter coupled between the coupler 104 and a full-wave rectifier defined by diodes D1-D4. The input filter may include a capacitor C1 coupled across the input terminals 104a and 104b upstream of the AC transformer T1 as well as a capacitor C2 and a resistor R13 each coupled across input terminals 104a and 104b downstream of the AC transformer T1. The AC transformer T1 may be configured as an input inductor in the input filter.

The AC conditioning circuitry may also include several surge protection components, such as a fuse F1, a gas discharge tube GDT1, and a varistor MOV1. The fuse F1 may be configured to open or break when a threshold current is exceeded. The gas discharge tube GDT1 may provide a visual indication of input power and selectively short during over-voltage conditions. The varistor MOV1 may also provide over-voltage protection by short-circuiting the input terminals 108 when a threshold voltage is exceeded.

The rectifier circuit may be configured to receive an AC voltage from the AC conditioning circuitry and rectify the AC voltage into a DC signal. The rectifier circuit includes diodes D1-D4 configured as a full-wave rectifier. The rectifier circuit may alternatively be configured as a half-wave rectifier.

The DC conditioning circuitry may be coupled between the rectifier circuit and the converter transformer T2 to reduce a ripple on the DC signal that is output from the rectifier circuit. The DC conditioning circuitry may include a polarized capacitor C3 having a first terminal coupled to the cathode terminals of D1 and D2 of the rectifier circuit. A second terminal of capacitor C3 is coupled to a cathode terminal of a diode D23, the diode D23 having an anode terminal coupled to the anode terminals of the diode D3 and diode D4 of the rectifier circuit. The DC conditioning circuitry may also include a diode D24 having an anode terminal coupled to the cathode terminal of the diode D23 and having a cathode terminal coupled to a first terminal of the resistor R2. A second terminal of the resistor R2 may be coupled to an anode terminal of the diode D25 and to a first terminal of the capacitor C4. A second terminal of the capacitor C4 may be coupled to the anode terminals of diodes D3, D4, and D23. The cathode terminal of diode D25 may be coupled to the cathode terminals of diodes D1 and D2 and to the first terminal of capacitor C3.

The converter transformer T2 may be coupled to receive an input voltage and/or current from the DC conditioning circuitry. The converter transformer T2 may have a primary winding PRI and an auxiliary winding AUX. The primary winding PRI may include at least two terminals that may be electrically connected to a passive circuit network including a diode D17, a resistor R8, a resistor R12, and a capacitor C6. The primary winding PRI may be configured to supply magnetic fields to a light source input secondary winding LIGHT SEC, the auxiliary winding AUX may provide a voltage reference to a pulse-width modulator through a number of passive components (i.e., through a resistor R16, a diode D21, a resistor R19, a capacitor C10, a capacitor C11, and a diode D29), and a 5-volt secondary winding +5V SEC may provide a voltage across a capacitor C15 through diode D28.

The light source input secondary winding LIGHT SEC may be coupled to the solid-state light source input smoothing circuitry. The solid-state light source input smoothing circuitry may include a diode D18, a capacitor C19, and a capacitor C14 to smooth the output of the converter transformer T2 before the output of the converter transformer T2 is supplied to the solid-state light sources 102 via terminals 110a and 110b of solid-state light source coupler J4.

The regulating circuit of the lighting device 200 may be electrically coupled between the transformer T2 and the solid-state light source coupler J4 to regulate the current flow through the transformer T2 and the solid-state light sources 102. The regulating circuit may include a switch Q1, a pulse-width modulator (PWM) U4, and a feedback circuit.

The switch Q1 may be an n-channel MOSFET having a gate terminal electrically coupled to the PWM U4, a drain terminal electrically coupled to the converter transformer T2, and a source terminal electrically coupled to a ground reference. The drain terminal and the source terminal of the switch Q1 may be connected in parallel across a capacitor C20. The switch Q1 may receive alternating voltage levels on the gate terminal to selectively cause current to flow through the primary winding PRI of the converter transformer T2 in order to induce current flow through the light source input secondary winding LIGHT SEC of the converter transformer T2.

The switch Q1 may sink current to the ground reference through a resistor R10, a resistor R11, and capacitor C7. The resistors R10, R11 and the capacitor C7 may be used in a power converter, such as the flyback converter illustrated in FIG. 2, to conduct electromagnetic interference (EMI) energy back into the primary side of the converter to enable the converter to pass electrical noise regulations established by a government agency, such as the FCC. The capacitor C7 has a value of approximately 10000 pF, according to one embodiment.

The PWM U4 may regulate current flow through the transformer T2 based at least in part on several PWM U4 inputs and outputs, such as a switch drive terminal DRV, a voltage sense terminal HV, a feedback terminal FB, and a current sense terminal CS. The PWM U4 may be an NCP1271 pulse-width modulator controller.

The PWM U4 may drive the switch Q1 through the switch driver terminal DRV to regulate the converter transformer T2. The switch driver terminal DRV may source up to 500 mA and sink up to 800 mA of current.

The PWM U4 may be coupled to sense the output of the rectifier circuit through a resistor R20 with the voltage sense terminal HV. The PWM U4 may begin a startup sequence, hiccup fault mode, and device protection based upon a voltage sensed at the voltage sense terminal HV.

The PWM U4 may adjust the duty cycle by which switch Q1 is operated based upon current sensed through the primary winding PRI at the current sense terminal CS. The current sense terminal CS receives a current through a resistor R15, and the PWM U4 adjusts the duty cycle based upon the sensed current.

The feedback terminal FB may be coupled to receive feedback signals, such as voltages, from the feedback circuit that are indicative of current flow through the solid-state light sources 102. A high feedback signal, e.g., voltage, may indicate inadequate current flow through the solid-state light sources 102. Accordingly, the PWM U4 may increase the current through the solid-state light sources 102 while the feedback terminal FB is high and decrease the current through the solid-state light sources 102 while the feedback terminal FB is low. Alternatively, a high feedback signal may indicate a surplus of current flow through the solid-state light sources 102. As a result, the PWM U4 may increase the current flowing through the solid-state light sources 102 while the feedback terminal FB is low and decrease the current flowing through the solid-state light sources 102 while the feedback terminal FB is high. As a further alternative, the PWM U4 may be enabled to operate while the feedback terminal FB is pulled low, and the PWM U4 may be operable to enter a fault mode while the feedback terminal FB is not pulled low, e.g., while the feedback pin FB>3 V. Accordingly, feedback signals received at the feedback terminal FB may determine adjustments made to the output intensity of the solid-state light sources 102.

The feedback circuit of the lighting device 200 may be coupled to the solid-state light sources 102 through the solid-state light source coupler J4 to determine the current flowing through the solid-state light sources 102. The feedback circuit may include an operational amplifier (opamp) circuit U1 and an optocoupler U2.

The opamp circuit U1 may utilize a current sense resistor R4 to compare the current through the solid-state light sources 102 to a voltage reference. The current sense resistor R4 may be configured to supply a return path to ground for the current flowing through the solid-state light sources 102. For example, the current sense resistor R4 may be coupled to the cathode of at least one of the solid-state light sources 102 through the output terminal 110b of the solid-state light source coupler J4. The current sense resistor R4 may have a very low resistance in order to permit current to flow from the solid-state light sources 102 to ground while still providing a voltage drop that is detectable by the opamp circuit U1.

The opamp circuit U1 may be configured to provide an output to drive the optocoupler U2 in response comparing the voltage drop across the current sense resistor R4 to the reference voltage. The opamp circuit U1 includes an inverting terminal and a non-inverting terminal. The inverting terminal may be connected to the voltage reference, and the non-inverting terminal may be connected to the current sense resistor R4 through a resistor R22. The opamp circuit U1 may output a high voltage while the voltage at the non-inverting terminal, e.g., across R4, is greater than the voltage at the inverting terminal, e.g., the reference voltage. In other words, the opamp circuit U1 may output a high voltage while the current flowing through the solid-state light sources 102 produces a voltage across the current sense resistor R4 that is greater than the reference voltage (i.e., threshold) at the inverting terminal of the opamp circuit U1. The opamp circuit U1 may output a low voltage while a voltage is not detected across current sense resistor or while the voltage detected across the current sense resistor R4 is less than the voltage at the inverting terminal. Accordingly, increasing and decreasing the voltage or threshold at the inverting terminal of the opamp circuit U1 determines the output of the opamp circuit U1, the operation of regulating circuit (e.g., PWM U4), and therefore the current through the solid-state light sources 102.

The voltage received by the opamp circuit U1 at the inverting terminal of the opamp circuit U1 may be an adjustable reference voltage. The adjustable reference voltage may be determined by the negative feedback configuration of the opamp circuit U1. For example, the negative feedback configuration may include a 5 V supply voltage and a plurality of passive electrical components, such as resistors R1, R3, R5, R6, R18, and capacitors C13, C16, C17, and C21. At least some of the plurality of passive electrical components may be configured as a voltage divider to reduce the adjustable reference voltage from the 5 V supply voltage to a lower voltage.

The optocoupler U2 transmits feedback signals, e.g., varying voltage levels, from the opamp circuit U1 to the feedback terminal FB based on whether current flows through the solid-state light sources 102. The optocoupler U2 includes a photon emitter and a phototransistor. The optocoupler U2 may be electrically connected to an output of the opamp circuit U1 through a resistor R21 and be configured to transmit feedback signals in response to the output of opamp circuit U1. The optocoupler U2 may be electrically connected to the feedback terminal FB of the PWM U4. The optocoupler U2 may also be electrically connected to a voltage supply, such as 8.5 V, through a resistor R7, a resistor R17, and a diode D26 to facilitate photon emissions. While the output of the opamp circuit U1 is high, the photon emitter of the optocoupler U2 emits photons to turn ON the phototransistor and pull the feedback terminal FB low. While the output of the opamp circuit U1 is low, the photon emitter of the optocoupler U2 does not emit photons, and the phototransistor remains OFF, enabling the feedback terminal FB to remain or return high. As discussed above, the PWM U4 may alter the quantity of current flowing through the solid-state light sources 102 in response to the level of the feedback terminal FB.

The resistive adjustment component R24 may be electrically connected to the driver electronics to adjust the output intensity of the solid-state light sources 102. In particular, the resistive adjustment component R24 may be electrically connected the voltage divider that is formed by at least some of the aforementioned passive electrical components of the negative feedback configuration of the opamp circuit U1. The resistive adjustment component R24 may be a potentiometer having at least two output terminals. The at least two output terminals may be coupled between the 5 V supply voltage and resistors R6 and R18 as part of the voltage divider circuit through a two-terminal connector J3.

The resistive adjustment component R24 may also include a user-engageable actuator configured to alter electrical characteristics between the at least two output terminals. For example, manipulation of the user-engageable actuator may increase and/or decrease a resistance between the at least two output terminals to correspondingly increase and/or decrease the adjustable reference voltage, i.e., the voltage at the inverting terminal of the opamp circuit U1. The resistive adjustment component R24 may include a resistor network having a plurality of discrete resistive values between which the user-engageable actuator may be switched to vary the reference voltage. Alternatively, the resistive adjustment component R24 may have a continuously adjustable resistor between the at least two output terminals. As discussed above, the user-engageable actuator may be a rotatable dial, a slideable lever, or an engagement structure selectively engageable by a portion of a tool and may continuously or discretely alter the electrical characteristics between the at least two terminals.

Adjusting the output of the resistive adjustment component R24 may affect the operation of the entire lighting device 200 by increasing and decreasing the adjustable reference voltage at the inverting terminal of the opamp circuit U1. For example, adjusting the output of the resistive adjustment component R24 may reduce the resistance between the at least two terminals of the resistive adjustment component R24. A decreased resistance between the at least two terminals of the resistive adjustment component R24 may result in an increase in the adjustable reference voltage. An increase in the adjustable reference voltage increases the threshold to which the voltage drop across the current sense resistor R4 is compared. Accordingly, decreasing the resistance between the at least two terminals of the resistive adjustment component R24 may result in an indication that current through the solid-state light sources 102 is insufficient and should be increased. In response to receiving said indication, the PWM U4 may increase the current flowing through the transformer T2 and therefore the current flowing through the solid-state light sources 102. Consequently, increasing the current flowing through the solid-state light sources 102 may result in higher output intensity from the solid-state light sources 102.

In summary, the feedback circuit may monitor current that is provided to the solid-state light sources 102 by the AC to DC converter, transmit feedback information to the PWM U4 of the regulating circuit, and adjust the feedback information transmitted to the PWM U4 in response to manipulation of by a user of the resistive adjustment component R24. Accordingly, a user may increase or decrease the output intensity of the solid-state light sources 102 by manipulating the user-engageable actuator of the resistive adjustment component R24.

The lighting device 200 may also include a blower circuit that includes power supply U3, capacitor C12 and connector J1. The power supply U3 may include a first terminal, a second terminal, and a third terminal. The first terminal may be connected to a power source, such as and 8.5 V power supply. The second terminal may be connected to a ground reference. The third terminal may be configured to output at least a portion of power received from the 8.5 V power supply. The capacitor C12 may be coupled between the second terminal and the third terminal and may be configured to store approximately 5 V. The connector J1 may have a first terminal and a second terminal. The capacitor C12 may be coupled between the first terminal and the second terminal of the connector J1. A blower may be electrically coupled between the first terminal and the second terminal of the connector J1. The blower may circulate air around the driver electronics and/or the solid-state light sources 102. The blower may be a synthetic jet actuator, air mover, or fan that is selectively operated to remove heat from the lighting device 200.

Figure 3A:
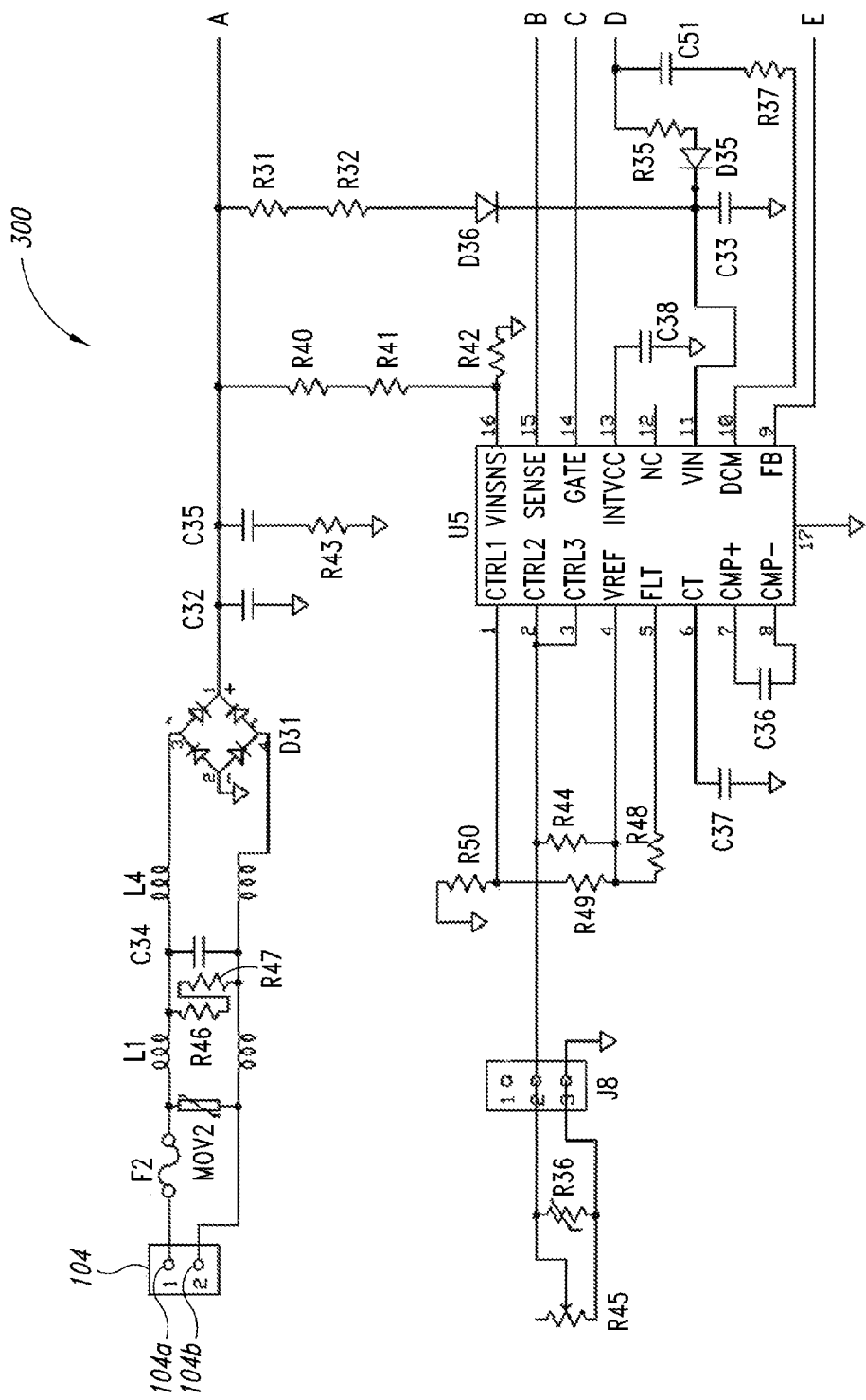
FIGS. 3A and 3B are a detailed electrical schematic diagram of a lighting device such as that illustrated in FIG. 1, according to another illustrated embodiment.
Figure 3B:
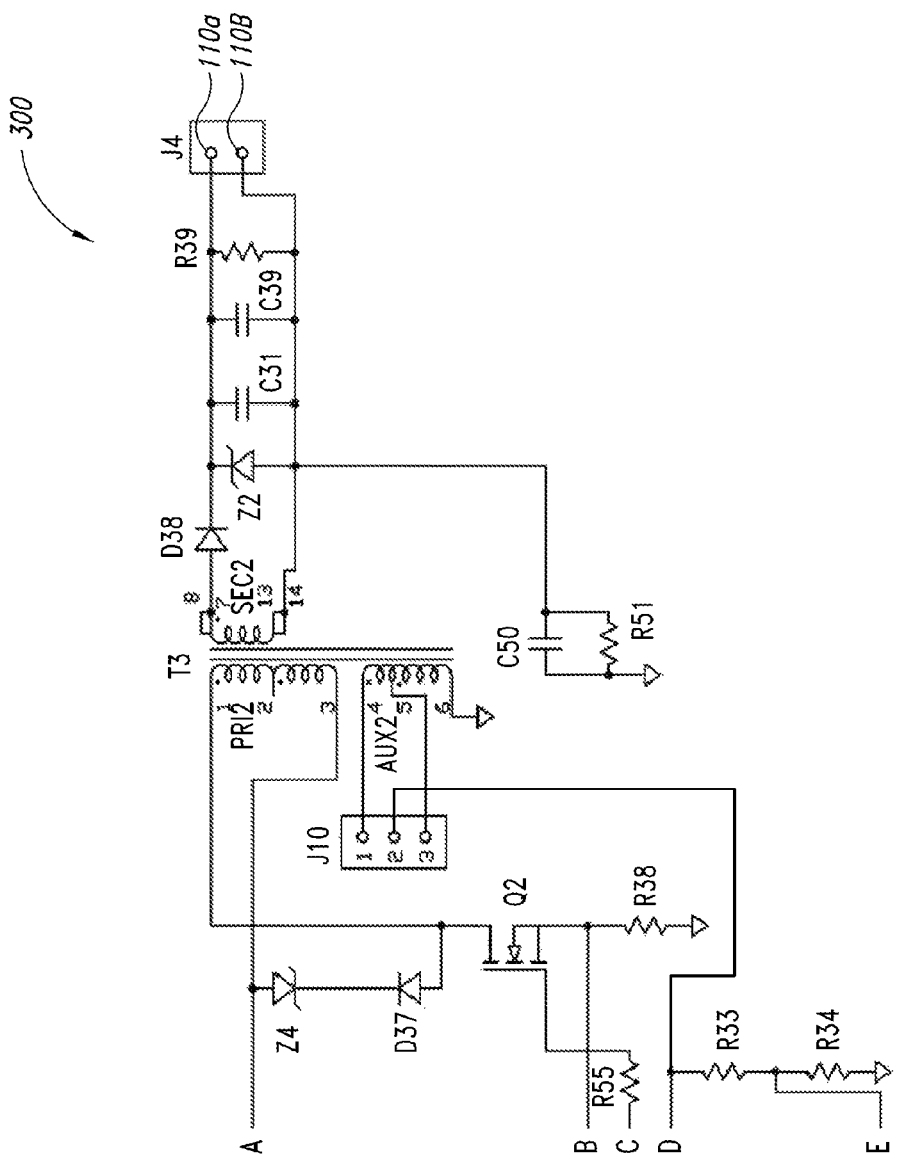

FIGS. 3a and 3b (collectively, FIG. 3) show a lighting device 300. The lighting device 300 may be a detailed implementation of the lighting device 100, according to another embodiment.

The lighting device 300 may, for example, include a flyback power converter to supply power to the solid-state light sources 102, as described above in connection with FIG. 1. The lighting device 300 may be roughly broken into four components, the coupler 104, a solid-state light source coupler J4, driver electronics, and a resistive adjustment component R45.

The driver electronics are electrically coupled between the coupler 104 and the solid-state light source coupler J4. The driver electronics of the lighting device 300 include AC conditioning circuitry, a rectifier circuit D31, DC conditioning circuitry, a converter transformer T3, solid-state light source input smoothing circuitry, and a regulating circuit.

The AC conditioning circuitry may include an input filter coupled between the coupler 104 and the full-wave rectifier defined by a rectifier circuit D31. The input filter may include a varistor MOV2, and inductor L1, resistors R46, R47, a capacitor C34, and an inductor L4. The AC conditioning circuitry may also include a fuse F2 to protect the lighting device 300 from voltage and current surges.

The rectifier circuit D31 may include diodes configured as a full-wave rectifier or a half-wave rectifier. As illustrated, the rectifier circuit D31 includes four diodes configured as a full-wave rectifier.

The DC conditioning circuitry may be coupled between the rectifier circuit D31 and the converter transformer T3 to reduce the ripple on the voltage and/or current signal that may be output from the rectifier circuit D31. The DC conditioning circuit may be coupled to an output of the rectifier circuit D31. The DC conditioning circuit may include a capacitor C32, a capacitor C35, and a resistor R43. The capacitor C32 may be coupled between the output of the rectifier circuit D31 and a ground reference. The capacitor C35 may be connected in electrical series with the resistor R43. The capacitor C35 and the resistor R43 may be coupled between the output of the rectifier circuit D31 and the ground reference.

The converter transformer T3 is coupled to receive an input voltage and/or current from the DC conditioning circuitry. The converter transformer T3 may have a primary winding PRI2, an auxiliary winding AUX2, and a secondary winding SEC2. The primary winding PRI2 may include at least one terminal that is electrically connected to the DC conditioning circuit. The primary winding PRI2 may be configured to supply magnetic fields to the secondary winding SEC2. The auxiliary winding AUX2 may be configured to provide a feedback voltage to the regulating circuit.

The secondary winding SEC2 may be coupled to solid-state light source input smoothing circuitry. The solid-state light source input smoothing circuitry may include a diode D38, a Zener diode Z2, a capacitor C31, a capacitor C39, a resistor R39, a capacitor C50 and a resistor R51 to smooth the output of the converter transformer T3 before the output of the converter transformer T3 is supplied to solid-state light sources 102 via the solid-state light source coupler J4. The Zener diode Z2 may be connected in electrical parallel to the capacitor C31, the capacitor C39, and the resistor R39.

The solid-state light source input smoothing circuitry may electrically connect to the solid-state light source coupler J4. The solid-state light source coupler J4 includes an output terminal 110a and 110b and may be a physically and electrically detachable coupler, such as a screw-type light receptacle, as described above in connection with FIG. 1. Alternatively, the solid-state light source coupler J4 may simply represent wires or electrical traces used to make permanent electrical connections between the driver electronics and the solid-state light sources 102.

The regulating circuit of the lighting device 300 may include a pulse-width modulator (PWM) U5 that is selectively coupled to the converter transformer T3 by a switch Q2 to adjust an output intensity of the solid-state light sources 102.

The PWM U5 is may be an LT3799 isolated flyback controller.

The PWM U5 includes a switch drive terminal GATE and drives the switch Q2 through the switch drive terminal GATE to regulate the converter transformer T3. The switch drive terminal GATE is electrically coupled to a gate of the switch Q2 through a resistor R55.

The switch Q2 may be an n-channel MOSFET having a gate terminal, a drain terminal, and a source terminal. The gate terminal may be connected to the switch drive terminal GATE of the PWM U5 to receive a drive signal from the PWM U5. The drain terminal may be connected to the primary winding PRI2 of the transformer T3. The source terminal may be electrically coupled to the ground reference through a resistor R38. The PWM U5 may turn switch Q1 ON at the gate terminal to permit current to flow through the primary winding PRI2 of the converter transformer T3 to store magnetic energy in the primary winding PRI of the converter transformer T3. The PWM U5 may turn switch Q2 OFF at the gate terminal to cause the magnetic energy that is stored in the primary winding PRI2 of the converter transformer T3 to be transferred to the secondary winding SEC2 of the converter transformer T3 in order to provide power to the solid-state light sources 102.

The PWM U5 may have several input terminals that are used to determine the duty cycle by which switch Q2 is operated. The PWM U5 may include a voltage input terminal VIN that is electrically coupled to the output of the rectifier circuit D31 through a resistor R31, a resistor R32, and a diode D36. The voltage input terminal VIN may provide power to the PWM U5. The PWM U5 may include a voltage sense terminal VINSNS that is coupled to the output of the rectifier circuit D31 through resistors R40, R41, and R42. The PWM U5 may include a current sense input terminal SENSE that is coupled to the source terminal of the switch Q2. The current sense input terminal SENSE may be used to monitor the amount of current flowing through the primary winding PRI2. The PWM U5 may increase and decrease the duty cycle and amplitude of the drive signal that is output to the gate output terminal GATE in response to one or both of the voltage sense terminal VINSNS and the current sense input terminal SENSE. Increases and decreases in the duty cycle of the drive signal may correspond to increases and decreases in current flowing from the secondary winding SEC2 to the solid-state light sources 102. Accordingly, increases and decreases in the duty cycle of the drive signal may correspond to increases and decreases in the output intensity of the solid-state light sources 102.

The PWM U5 increase and decrease the duty cycle of the drive signal in response to changes on additional input terminals. In particular, the PWM U5 may include current control terminals CTRL1, CTRL2, and CTRL3. The current control terminals CTRL1, CTRL2, and CTRL3 may be responsive to voltage levels present at the terminals. The control terminals CRTL2 and CTRL3 may be tied together, and the voltage level at the current control terminals CTRL2 and CTRL3 may be at least partially determined by the resistive adjustment component R45.

The resistive adjustment component R45 may be electrically coupled or connected to the driver electronics to increase and decrease the output intensity of the solid-state light sources 102. The resistive adjustment component R45 may be electrically coupled between the current control terminals CTRL2 and CTRL3 and the ground reference. The resistive adjustment component R45 may provide a variable voltage level at the current control terminals CTRL2 and CTRL3 through a connector J8 having a first terminal and a second terminal. The resistive adjustment component R45 includes at least two output terminals that are coupled between the first terminal and the second terminal of the connector J8.

The resistive adjustment component R45 may be electrically coupled through a resistor R44 to an output reference voltage terminal VREF of the PWM U5. The output reference voltage terminal VREF supplies current through the resistor R44 and the resistive adjustment component R45 which produces a voltage drop across the resistive adjustment component R45. The voltage drop across the resistive adjustment component R45 at least partially determines the voltage level at the current control terminals CTRL2 and CTRL3.

The resistive adjustment component R45 includes a user-engageable actuator and provides a variable voltage level at the control terminals CTRL2 and CTRL3 in response to a position of the user-engageable actuator. As discussed above, the user-engageable actuator may be a rotatable dial, a slideable lever, or an engagement structure that is selectively engageable by a tool. The position of the user-engageable actuator relative to a range of positions of the user-engageable actuator may determine at least one electrical characteristic, such as resistance, between the at least two terminals of the resistive adjustment component R45. The user-engageable actuator is configured to selectively increase and decrease the at least one electrical characteristic, such as resistance, between the at least two terminals of the resistive adjustment component R45 in response to manipulation by a user of the user-engageable actuator. The PWM U5 drives the switch Q2 from the switch drive terminal GATE based upon the voltage level at the control terminals CTRL2 and CTRL3. Accordingly, because manipulation of the user-engageable actuator increases and/or decreases the voltage level at the control terminals CTRL2 and CTRL3, the PWM U5 increases and decreases the duty cycle (and consequently the output intensity of the solid-state light sources 102) of the drive signal in response to manipulation of the user-engageable actuator of the resistive adjustment component R45.

In summary, manipulation of the at least one electrical characteristic between the at least two output terminals of the resistive adjustment component R45 may increase and decrease voltage levels at input terminals of the PWM U5 causing a respective increase and/or decrease in the output intensity of the solid-state light sources 102.

Figure 4A:
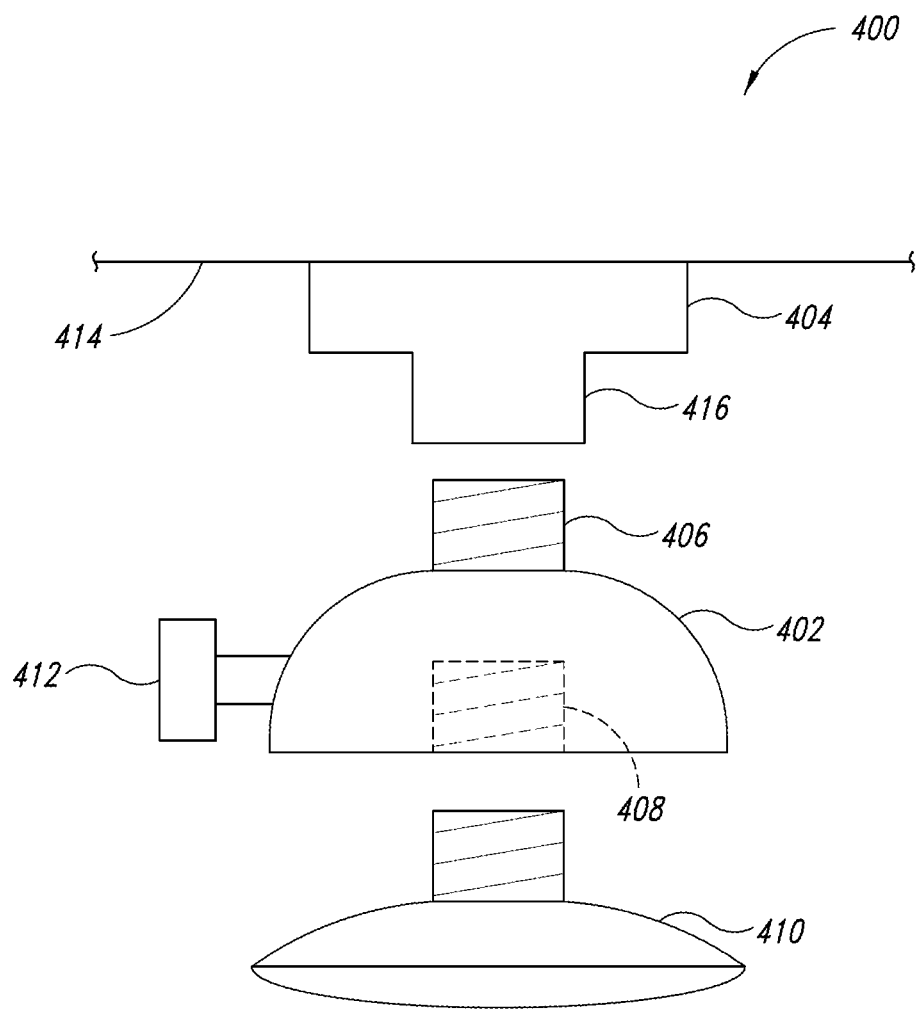
FIG. 4A is a partially exploded side elevational view of a lighting device such as that illustrated in FIG. 1, according to one illustrated embodiment in which a light source is selectively coupleable to a retrofit converter that includes drive electronics, and which is in turn selectively coupleable to a source of power such as a receptacle or other fixture (e.g., recessed or non-recessed fixture).
Figure 4B:
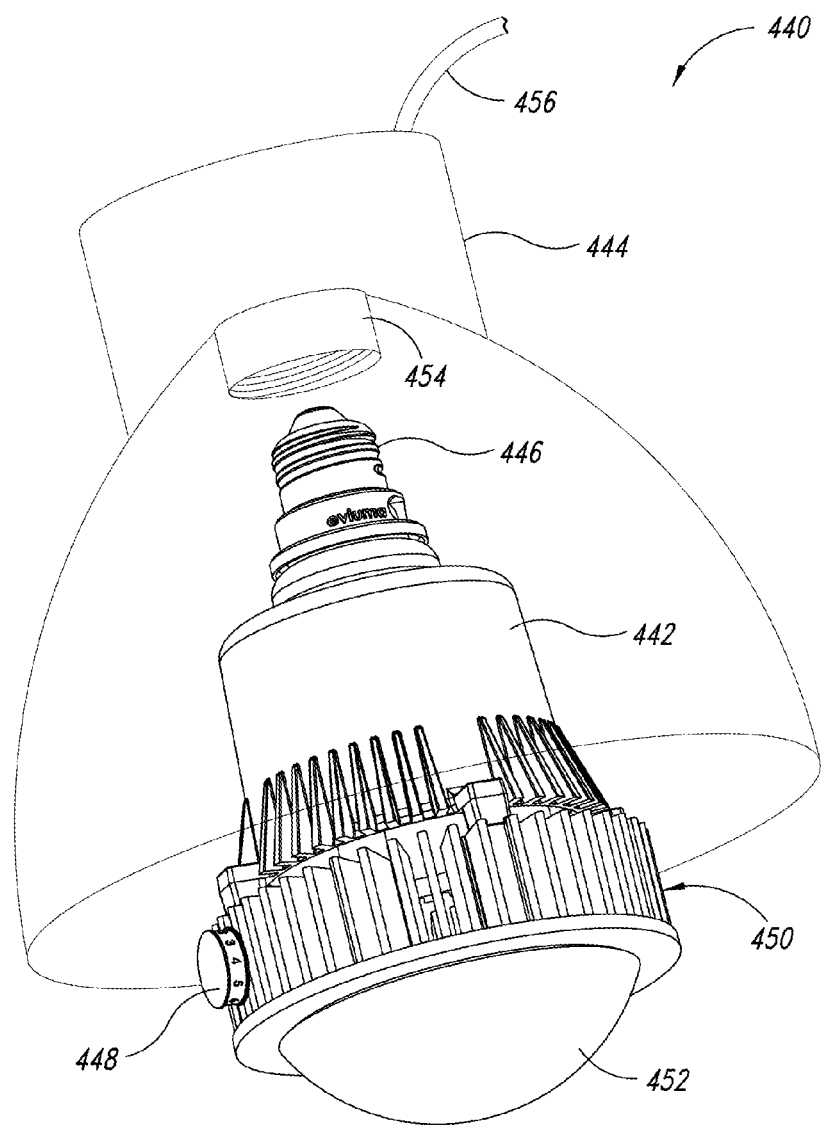
FIG. 4B is a perspective view of a lighting device such as that illustrated in FIG. 1, according to one illustrated embodiment in which a luminarie lighting system which includes a light source, drive electronics, and thermal management features are selectively coupleable to a fixture.

FIGS. 4A-4B illustrate various embodiments of the lighting devices 100, 200, and 300.

FIG. 4A illustrates a lighting device 400. The lighting device 400 includes a retrofit converter 402 a fixture 404 and a solid-state light sources 410.

The retrofit converter 402 includes a physically and electrically detachable coupler 406, a receptacle 408, and a user-engageable actuator 412. The retrofit converter 402 houses driver electronics that are configured to receive power, such as a line voltage, from the fixture 404 through the coupler 406 to supply power to the receptacle 408 that is adequate to power the solid-state light sources 410. The output intensity of the solid-state light sources 410 may be increased and decreased by manipulating the user-engageable actuator 412 that is at least partially carried by the retrofit converter 402. As shown, the user-engageable actuator 412 is received by the retrofit converter 402 through an aperture in the retrofit converter 402.

The fixture 404 is configured to provide power to the retrofit converter 402. The fixture 404 may be affixed to a ceiling 414. The fixture 404 may include a receptacle 416 that physically and electrically detachably couples to the coupler 406 of the retrofit converter 406.

FIG. 4B illustrates a lighting system 440. The lighting system 440 includes a lighting device 442 and a fixture 444.

The lighting device 442 includes a physically and electrically detachable coupler 446, a user-engageable actuator 448, a plurality of thermal fins 450, and a lens 452. The coupler 446 receives power, such as a 120 V 60 Hz line voltage, and provides the received power to driver electronics, such as a power supply, that is housed by the lighting device 442. The user-engageable actuator 448 increases and decreases an output intensity of a solid-state light according to the techniques disclosed herein. The solid-state light sources may be partially enclosed by the lens 452 and may be powered by the driver electronics housed by the lighting device 442. The plurality of thermal fins 450 may be used to minimize heat trapped within the lighting device 442.

The fixture 444 may include a receptacle 454 and an electrical conductor 456. The receptacle 454 may physically and electrically detachably receive the coupler 446 to transfer power to the lighting device 442. The fixture 444 may receive power through the electrical conductor 456 and route the received power to the receptacle 454 for transfer to the lighting device 442.

Figure 5A:
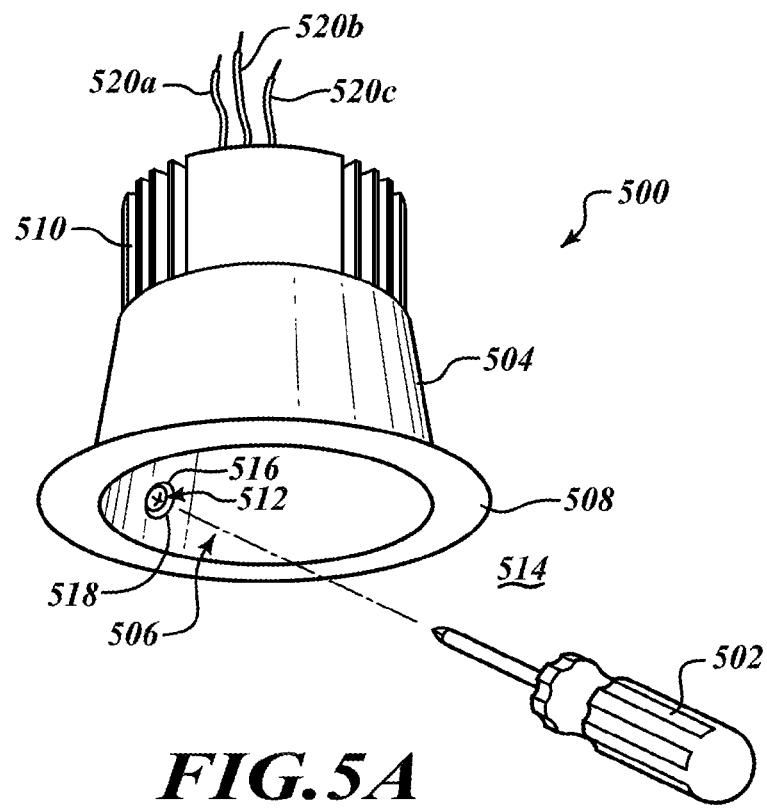
FIG. 5A is a perspective view of a lighting device such as that illustrated in FIG. 1 and a tool, according to one illustrated embodiment in which takes the form of a complete luminarie for installation as a fixture in a portion of a structure such as a ceiling of a room of a building.

FIG. 5A shows a lighting device 500 and tool 502, according to one illustrated embodiment, which takes the form of a complete luminarie for installation as a fixture in a portion of a structure such as a ceiling of a room of a building.

The lighting device or luminarie 500 may take any of the forms illustrated in FIG. 1, 2A or 2B. The lighting device or luminarie 500 may include a housing 504, open at a proximal end 506 from which light emits. The lighting device or luminarie 500 may include a bezel 508 or similar structure located at least proximate the proximal end 506. The bezel 508 may be formed as an integral, unitary single part of the housing 504, or may be selectively detachable coupleable thereto. The bezel 508 may be useful where the lighting device or luminarie 500 is provided in the form of a "can light" for recessed installation. The lighting device or luminarie 500 may include thermal fins 510 or other exposed heat transfer structure. Such may be distributed and/or located to allow effective convective and radiant cooling.

The lighting device or luminarie 500 may include a user-engageable actuator 512 physically manipulable by a user and accessible by the user from an exterior 514 of the lighting device 500 to vary an output of the adjustment component (not shown in FIG. 5A). The user-engageable actuator 510 may take a large variety of forms, and may be positioned in a large variety of locations. As illustrated, the user-engageable actuator 510 is a rotatable member with a head 516 and shaft (not shown). The head may be similar to that found on a screw, having one or more slots to receive a portion of the tool 502, for instance a blade of a flat blade screw driver, a socket of a socket wrench or drive, or a tip of a hex wrench. The head 516 may additionally, or alternatively be ribbed (not shown) around a peripheral edge to allow secure engagement by a user's fingers. The head may be recessed and accessible through a port, hole or aperture 518, for example by insertion of a portion of the tool 502.

In contrast to that shown in FIG. 4B, the lighting device or luminarie 500 includes wires 520a-520c (collectively 520) to make electrical connection to wiring in the structure. The lighting device or luminarie 500 may, for example, include three separate wires 520a, 520b, 520c, one severing as a ground, to receive power via conventional AC single phase wiring commonly found in commercial and residential buildings. Other numbers of wires, and wiring configurations may be employed.

Also, in contrast to the embodiment of FIG. 4B, where intended for below surface mounting (e.g., "can lighting") the thermal fins 510 or other exposed heat transfer structure, may be spaced relatively rearwardly from the proximal end 506 or front of the lighting device or luminarie 500. This may advantageously space the thermal fins 510 or other exposed heat transfer structure sufficiently away from a surface in which the lighting device or luminarie 500 is fixed or installed, to ensure adequate airflow and hence convective cooling thereof.

Figure 5B:
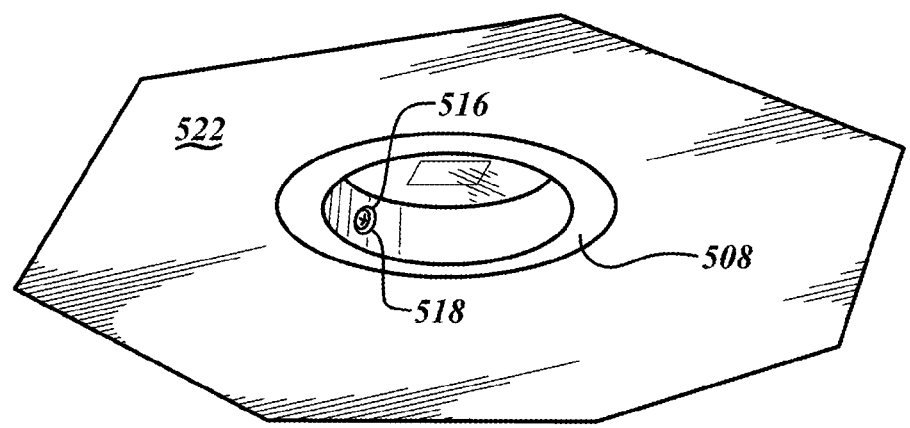
FIG. 5B is a perspective view of the lighting device of FIG. 5A, installed as a fixture in a portion of a ceiling of a room of a building, according to one illustrated embodiment.

FIG. 5B shows the lighting device or luminarie 500 mounted as a fixture in a portion of a structure, for example a ceiling 522 of a building. The solid-state light sources 524 are visible in FIG. 5B.

While illustrated as recessed mounted in the fashion of "can lighting", the lighting device or luminarie 500 may be mounted extending from the surface. Further, the lighting device or luminarie 500 may be mounted as fixture to other structures or portions of structures. As used herein and in the claims, the term fixture is used in its usual sense, that is an object mounted in a secure, essentially permanent manner, removal of which would result in damage to the object and/or structure, or would require tools.

The specific values, such as voltages, used herein are purely illustrative, and are not meant to be in anyway limiting on the scope. Likewise, the arrangements and topologies are merely illustrative and other arrangements and topologies may be employed where consistent with the teachings herein. While specific circuit structures are disclosed, other arrangements that achieve similar functionality may be employed.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A lighting device to provide manually adjustable levels of solid state lighting, the lighting device comprising:
 an adjustment component having a user-engageable actuator physically manipulable by a user and accessible by the user from an exterior of the lighting device to vary an output of the adjustment component; and
 a driver circuit electrically coupled to adjust an amount of light output by a number of solid-state light sources in response to the output of the adjustment component, the driver circuit including:
  a feedback circuit which provides a feedback signal responsive to current flowing through the solid-state light sources, the feedback circuit electrically couples to the adjustment component, and physical manipulation of the user-engageable actuator of the adjustment component by a user directly affects the feedback signal; and
  a controller comprising an input terminal that receives the feedback signal from the feedback circuit, the driver circuit adjusts the amount of light output by the solid-state light sources based at least in part on the output of the adjustment component received through the feedback circuit at the input terminal.

2. The lighting device of claim 1 wherein the adjustment component is at least one of a potentiometer or a rheostat.

3. The lighting device of claim 1 wherein the driver circuit includes a power converter having an output power level that is responsive to a control voltage supplied to the power converter as the output of the adjustment component.

4. The lighting device of claim 1 wherein the driver circuit includes a power converter having an output supplied to the solid-state light sources with a duty cycle that is responsive to the output of the adjustment component.

5. The lighting device of claim 1 wherein the user-engageable actuator or the adjustment component has a finite number of distinct settings, where each of the distinct settings selects a respective resistance of the adjustment component.

6. The lighting device of claim 1 further comprising:
 a housing that houses the driver circuit and at least a portion of the adjustment component.

7. The lighting device of claim 6, further comprising:
 the number of solid-state light sources, wherein the solid-state light sources are housed by the housing.

8. The lighting device of claim 6 wherein the actuator includes at least one of a knob or a slide at least partially extending from the housing.

9. The lighting device of claim 6 wherein the actuator includes at least one of a knob or a slide received within the housing and accessible therefrom via a tool or direct contact by the user.

10. The lighting device of claim 1 wherein the lighting device is a luminaire lighting fixture fixable to a portion of a building and the user-engageable actuator is accessible by the user while the luminaire lighting fixture is fixed to the portion of the building.

11. The lighting device of claim 1 wherein the lighting device has at least one complementary coupler that physically and electrically detachably couples a lighting device to a lighting fixture and that transfers power from the lighting fixture to the lighting device.

12. A lighting device for use with solid-state light sources and for use with lighting fixtures having at least one coupler configured to provide detachable physical and electrical connections therewith, the lighting device comprising:
 at least one complementary coupler that physically and electrically detachably couples to the coupler of the lighting fixture and that transfers power from the lighting fixture to the lighting device;
 a resistive adjustment component having at least two terminals and having a user-engageable actuator that varies an output of the resistive adjustment component between the at least two terminals in response to physical manipulation by a user; and
 a set of driver electronics electrically coupled between the complementary coupler and the resistive adjustment component and which adjusts an amount of light output by the solid-state light sources based at least in part on the output of the resistive adjustment component, the set of driver electronics including:
  a feedback circuit which provides a feedback signal responsive to current flowing through the solid-state light sources, the feedback circuit electrically couples to at least one of the at least two terminals of the resistive adjustment component, and physical manipulation of the user-engageable actuator of the resistive adjustment component by a user directly affects the feedback signal; and a controller comprising an input terminal that receives the feedback signal from the feedback circuit, the set of driver electronics adjusts the amount of light output by the solid-state light sources based at least in part on the output of the resistive adjustment component received through the feedback circuit at the input terminal.

13. The lighting device of claim 12, further comprising:

a housing having a cavity and an aperture that provides access from an exterior to the housing, the housing physically coupled to the at least one complementary coupler, the resistive adjustment component and the set of driver electronics at least partially received in the cavity of the housing.

14. The lighting device of claim 13 wherein the user-engageable actuator includes an engagement structure selectively engageable by a portion of a tool received through the aperture in the housing.

15. The lighting device of claim 13 wherein the user-engageable actuator includes a rotatable dial that is accessible from an exterior of the housing through the aperture.

16. The lighting device of claim 13 wherein the user-engageable actuator is a slideable lever that is accessible from the exterior of the housing through the aperture and operation of which varies a resistance between the at least two terminals of the resistive adjustment component.

17. The lighting device of claim 13, further comprising:

a second coupler that provides detachable physical and electrical connections to the solid-state light sources having a second complementary coupler that physically and electrically detachably couples to the second coupler, the second coupler at least partially received in the housing.

18. The lighting device of claim 13, further comprising:

a lens physically coupled to the housing, wherein the housing and the lens enclose the solid-state light sources.

19. The lighting device of claim 12 wherein the resistive adjustment component includes a resistive network electrically coupled between the at least two terminals of the resistive adjustment component, the resistive network having a plurality of discrete resistive values, and the user-engageable actuator selectively switches between each of the plurality of discrete resistive values to vary the output of the resistive adjustment component.

20. The lighting device of claim 12 wherein the feedback circuit includes a voltage divider having at least three terminals, one of which is an output terminal, and one of the at least two terminals of the resistive adjustment component electrically connects to the output terminal of the voltage divider, wherein the resistive adjustment component varies the voltage divider in response to manipulation of the user-engageable actuator by the user.

21. The lighting device of claim 12 wherein the feedback circuit includes an amplifier having a feedback path and the feedback path of the amplifier is negative.

22. The lighting device of claim 12 wherein the resistive adjustment component is a potentiometer that increases and decreases the amount of light output by the solid-state light sources by at least partially determining the feedback received at the input terminal.

23. A lighting system, comprising:

a plurality of lighting devices each coupled to a common supply circuit, each of the lighting devices comprising:

a respective adjustment component having a user-engageable actuator physically manipulable by a user and accessible by the user from an exterior of the respective lighting device to vary an output of the adjustment component; and a respective driver circuit electrically coupled to adjust an amount of light output by a number of solid-state light sources of the respective lighting device in response to the output of the respective adjustment component, each of the respective driver circuits including:

a feedback circuit which provides a feedback signal responsive to current flowing through the respective number of solid-state light sources, the feedback circuit electrically couples to the respective adjustment component, and physical manipulation of the user-engageable actuator of the respective adjustment component by a user directly affects the feedback signal; and a controller comprising an input terminal that receives the feedback signal from the respective feedback circuit, the driver circuit adjusts the amount of light output by the respective number of solid-state light sources based at least in part on the output of the respective adjustment component received through the feedback circuit at the input terminal.

* * * * *